US012727488B2

(12) United States Patent
Numazaki et al.

(10) Patent No.: US 12,727,488 B2
(45) Date of Patent: Sep. 1, 2026

(54) SEMICONDUCTOR DEVICE

(71) Applicant: Renesas Electronics Corporation, Tokyo (JP)

(72) Inventors: Masato Numazaki, Tokyo (JP); Youichi Abe, Tokyo (JP); Tatsuaki Tsukuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 283 days.

(21) Appl. No.: 18/437,894

(22) Filed: Feb. 9, 2024

(65) Prior Publication Data

US 2024/0304526 A1 Sep. 12, 2024

(30) Foreign Application Priority Data

Mar. 10, 2023 (JP) ................................ 2023-037812

(51) Int. Cl.
*H10W 70/40* (2026.01)
*H10W 72/00* (2026.01)
(Continued)

(52) U.S. Cl.
CPC ....... *H10W 70/417* (2026.01); *H10W 70/421* (2026.01); *H10W 74/111* (2026.01);
(Continued)

(58) Field of Classification Search
CPC ............. H10W 70/417; H10W 70/421; H10W 70/465; H10W 70/457; H10W 72/075;
(Continued)

(56) References Cited

U.S. PATENT DOCUMENTS 5,497,032 A 3/1996 Tsuji et al.
6,703,696 B2 * 3/2004 Ikenaga .............. H10W 74/019 257/E23.037
(Continued)

FOREIGN PATENT DOCUMENTS

CN 201936874 U * 8/2011 ........ H10W 72/0198
JP H07-231069 A 8/1995
(Continued)

OTHER PUBLICATIONS

Office Action received in corresponding Japanese Patent Application No. 2023-037812, dated Jul. 7, 2026.

*Primary Examiner* — Matthew E Warren
(74) *Attorney, Agent, or Firm* — Rimon P.C.

(57) ABSTRACT

A semiconductor device includes: a die pad having an upper surface; a semiconductor chip; a plurality of leads; and a plurality of wires. The upper surface includes: a first region in which the semiconductor chip is mounted; a second region surrounding the first region in plan view; and a third region surrounding the second region in plan view. Also, a first metal film is provided in the second region. Further, a second metal film is provided in the third region. Here, in plan view, the semiconductor chip, the first meal film and the second metal film are spaced apart from one another. Also, the plurality of wires includes: a first wire bonded to each of a first electrode of the plurality of electrodes and the first metal film; and a second wire bonded to each of a first lead of the plurality of leads and the second metal film.

17 Claims, 14 Drawing Sheets

(51) Int. Cl.

| | |
|---|---|
| ***H10W 72/50*** | (2026.01) |
| ***H10W 72/90*** | (2026.01) |
| ***H10W 74/10*** | (2026.01) |
| ***H10W 90/00*** | (2026.01) |

(52) U.S. Cl.
CPC ........ *H10W 90/755* (2026.01); *H10W 72/536* (2026.01); *H10W 72/5363* (2026.01); *H10W 72/884* (2026.01); *H10W 72/9445* (2026.01); *H10W 90/736* (2026.01); *H10W 90/756* (2026.01)

(58) Field of Classification Search
CPC ... H10W 72/30; H10W 72/50; H10W 72/536; H10W 72/5363; H10W 72/851; H10W 72/884; H10W 72/90; H10W 72/9445; H10W 74/111; H10W 90/736; H10W 90/755; H10W 90/756; H10W 90/811
See application file for complete search history.

(56) References Cited

U.S. PATENT DOCUMENTS

| | | | | |
|---|---|---|---|---|
| 6,713,849 B2 * | 3/2004 | Hasebe | H10W 70/411 | 257/667 |
| 6,770,963 B1 * | 8/2004 | Wu | H10W 20/427 | 257/E23.079 |
| 10,770,375 B2 * | 9/2020 | Shibata | H10W 70/411 | |
| 2006/0035414 A1 * | 2/2006 | Park | H10W 70/424 | 438/123 |
| 2012/0113609 A1 | 5/2012 | Park et al. | | |
| 2014/0224534 A1 * | 8/2014 | Kubota | H10W 70/457 | 438/123 |
| 2025/0233085 A1 * | 7/2025 | Hayashiguchi | H10W 42/121 | |

FOREIGN PATENT DOCUMENTS

| | | | | | |
|---|---|---|---|---|---|
| JP | 2000-299423 A | | 10/2000 | |
| JP | 2004-343151 A | | 12/2004 | |
| JP | 2012-104830 A | | 5/2012 | |
| JP | 2012212897 A | * | 11/2012 | H10W 72/30 |
| JP | 2013120768 A | * | 6/2013 | H10W 72/0198 |
| JP | 2019-145625 A | | 8/2019 | |
| WO | WO-2013078753 A1 | * | 6/2013 | H10W 74/014 |

* cited by examiner

FIG. 8

SEMICONDUCTOR DEVICE

CROSS-REFERENCE TO RELATED APPLICATIONS

The disclosure of Japanese Patent Application No. 2023-037812 filed on Mar. 10, 2023, including the specification, drawings and abstract is incorporated herein by reference in its entirety.

BACKGROUND

The present disclosure relates to a semiconductor device.

Here, there are disclosed techniques listed below.

[Patent Document 1] Japanese Unexamined Patent Application Publication No. 2019-145625

In a semiconductor device in which a semiconductor chip is mounted on a die pad and the semiconductor chip is sealed with a sealing body, there is a technique of electrically connecting the semiconductor chip and the die pad via a wire (Patent Document 1).

SUMMARY

In some cases, a wire is used as a conductive member that electrically connects a semiconductor chip mounted on a die pad and a lead arranged around the die pad. From the viewpoint of improving the performance (e.g., electric properties) of a semiconductor device, a length of the wire is preferably short. However, when a size of the semiconductor chip is small with respect to a size of the die pad, a distance between an electrode of the semiconductor chip and the lead may be long.

Other objects and novel features will become apparent from the description of this specification and the accompanying drawings.

A semiconductor device according to one embodiment, includes: a die pad having a first surface; a semiconductor chip; a plurality of leads; and a plurality of wires. The first surface of the de pad includes: a first region in which the semiconductor chip is mounted; a second region surrounding the first region in plan view and in which a first metal film is provided; and a third region surrounding the second region in plan view and in which a second metal film is provided. Here, in plan view, the semiconductor chip, the first meal film and the second metal film are spaced apart from one another. Also, the plurality of wires includes: a first wire bonded to each of a first electrode of the plurality of electrodes and the first metal film; and a second wire bonded to each of a first lead of the plurality of leads and the second metal film.

According to the above embodiment, it is possible to improve the performance of the semiconductor device.

BRIEF DESCRIPTION OF THE DRAWINGS

FIG. 8 is an enlarged cross-sectional view taken along a line C-C shown in FIG. 6.

DETAILED DESCRIPTION

Figure 1:
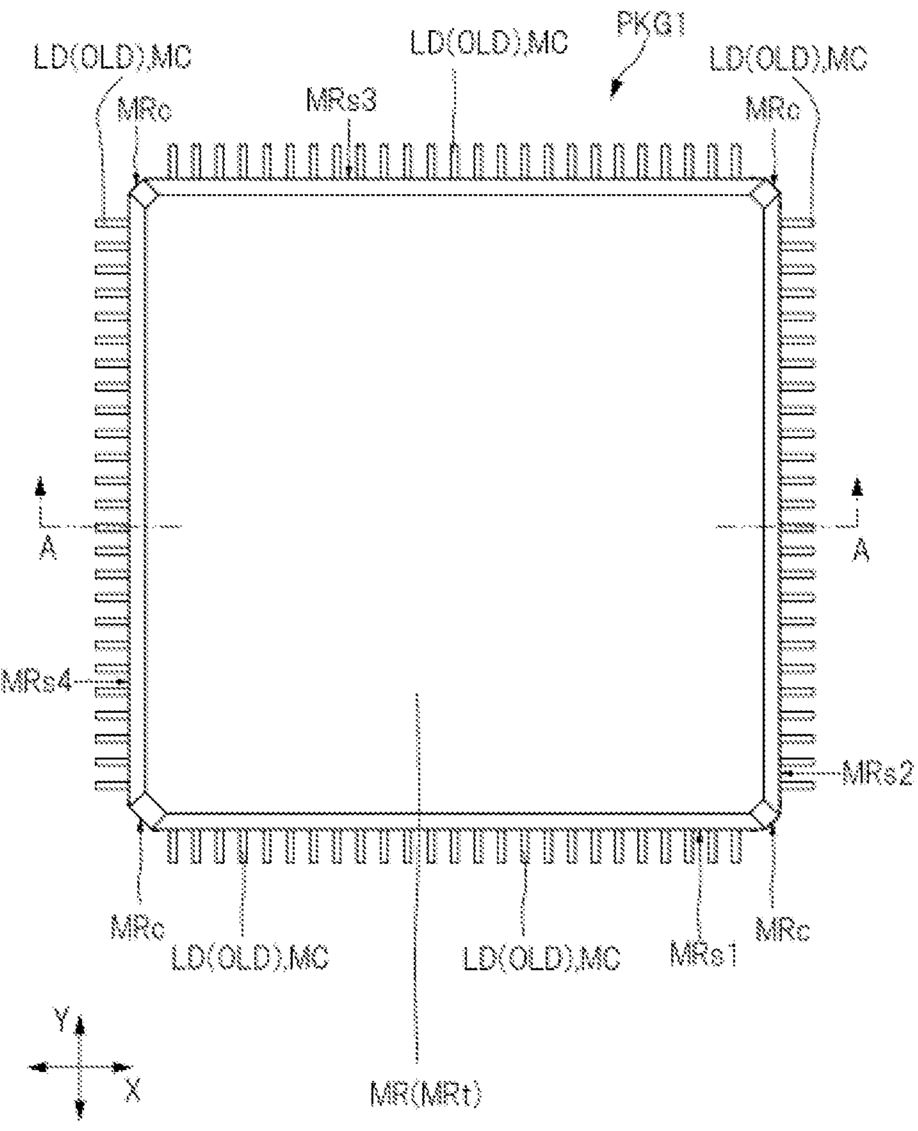
FIG. 1 is an upper surface view of a semiconductor device according to one embodiment.

Description of Forms, Basic Terms and Usage in This Application

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, gold plating, Cu layers, nickel plating, and the like, unless otherwise specified, not only pure, but also gold, Cu, nickel, and the like as the main constituent members, respectively, shall be included.

In addition, reference to a specific numerical value or quantity may be greater than or less than that specific numerical value, unless expressly stated otherwise, theoretically limited to that number, and obviously not so from the context.

In the drawings of the embodiments described below, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition hatching or dot patterns may be added to indicate that the region is not a void even if it is not a cross-section or to indicate the boundary of the area.

In the following description, the electrode of the semiconductor chip means a member that functions as an external terminal of the semiconductor chip. A pad that is a plate-shaped member having a small area among the electrodes is referred to as "electrode pad". In addition, a member formed so as to locally protrude from the base of the electrode is referred to as "bump electrode" or "protrusion electrode". Also, any of the "electrode pad" and the "bump electrode (or protruding electrode)" may be simply referred to as "electrode". Further, a structure in which a bump electrode (or protruding electrode) is formed on the electrode pad is sometimes referred to as "electrode".

In the following description, the directions of the X direction, the Y direction, and the Z direction may be used. For example, in FIG. 1 to be described later, the X direction and the Y direction are shown. The X direction and the Y direction intersect each other. In the example described below, the X direction is orthogonal to the Y direction. Hereinafter, X-Y plane including the X direction and the Y direction will be described as a plane parallel to the main surface of semiconductor device and the main surface of the mounting substrate.

A plane intersecting X-Y plane (for example, a plane parallel to X-Z plane including the X direction and the Z direction and a plane parallel to Y-Z plane including the Y direction and the Z direction) is referred to as "side surface". In the following explanations, unless explicitly stated otherwise, the term "in plan view" means a view of a plane parallel to X-Y plane. Further, the normal direction with respect to X-Y plane will be described as the "Z direction" or the thickness direction. "Thickness" and "height" refer to the length in the "Z-direction", unless expressly specified otherwise. The X direction, the Y direction, and the Z direction are directions intersecting each other, and more specifically, directions orthogonal to each other.

Semiconductor Device

Figure 2:
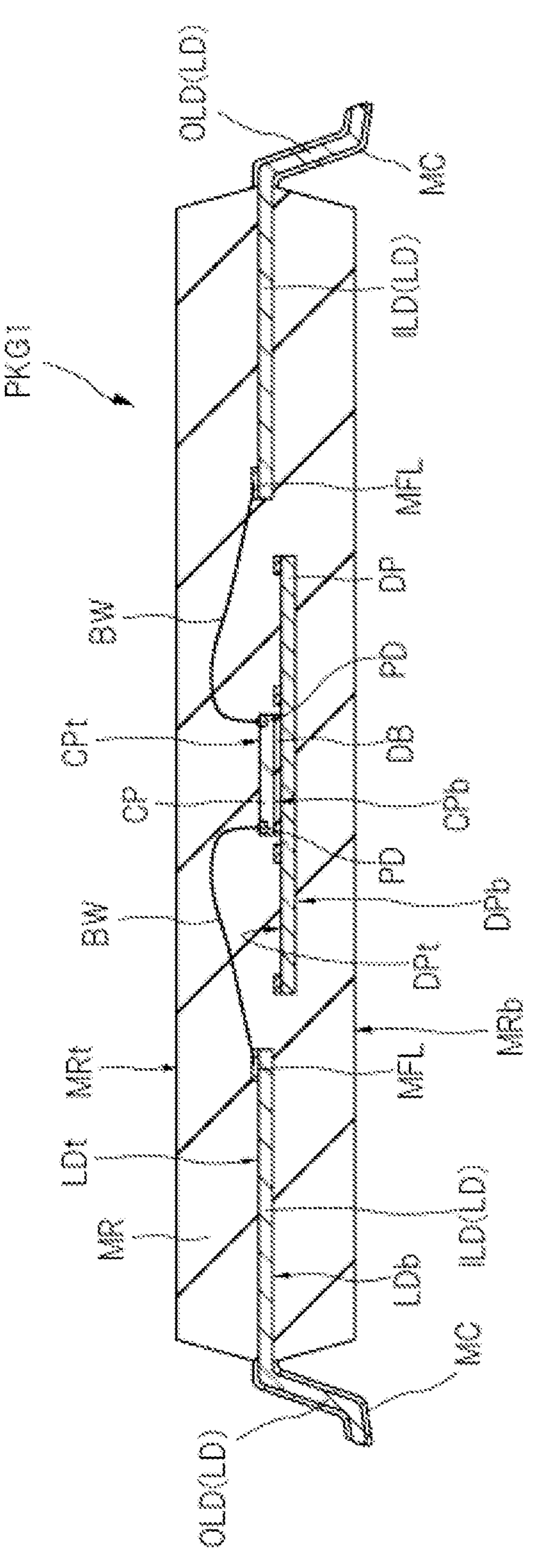
FIG. 2 is a cross-sectional view taken along a line A-A shown in FIG. 1.
Figure 3:
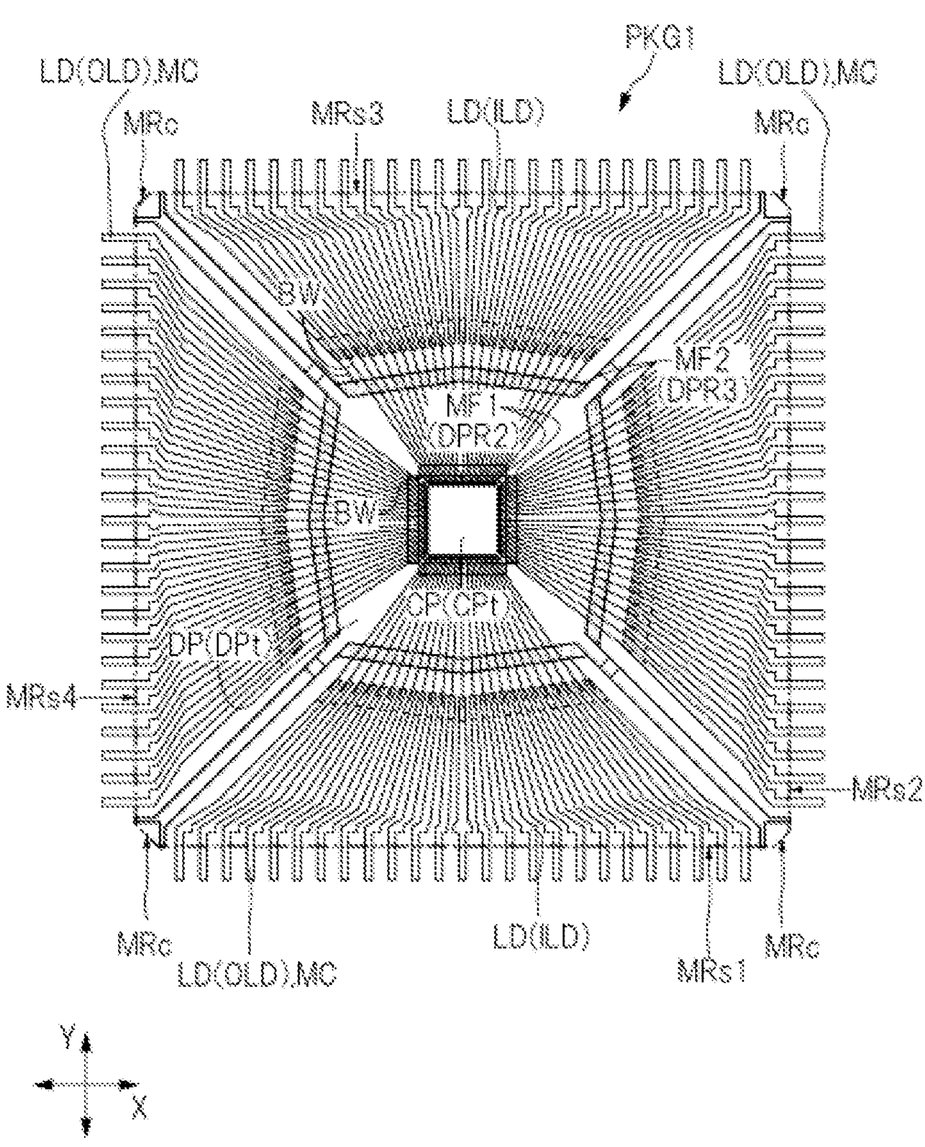
FIG. 3 is a perspective plan view of FIG. 1.
Figure 4:
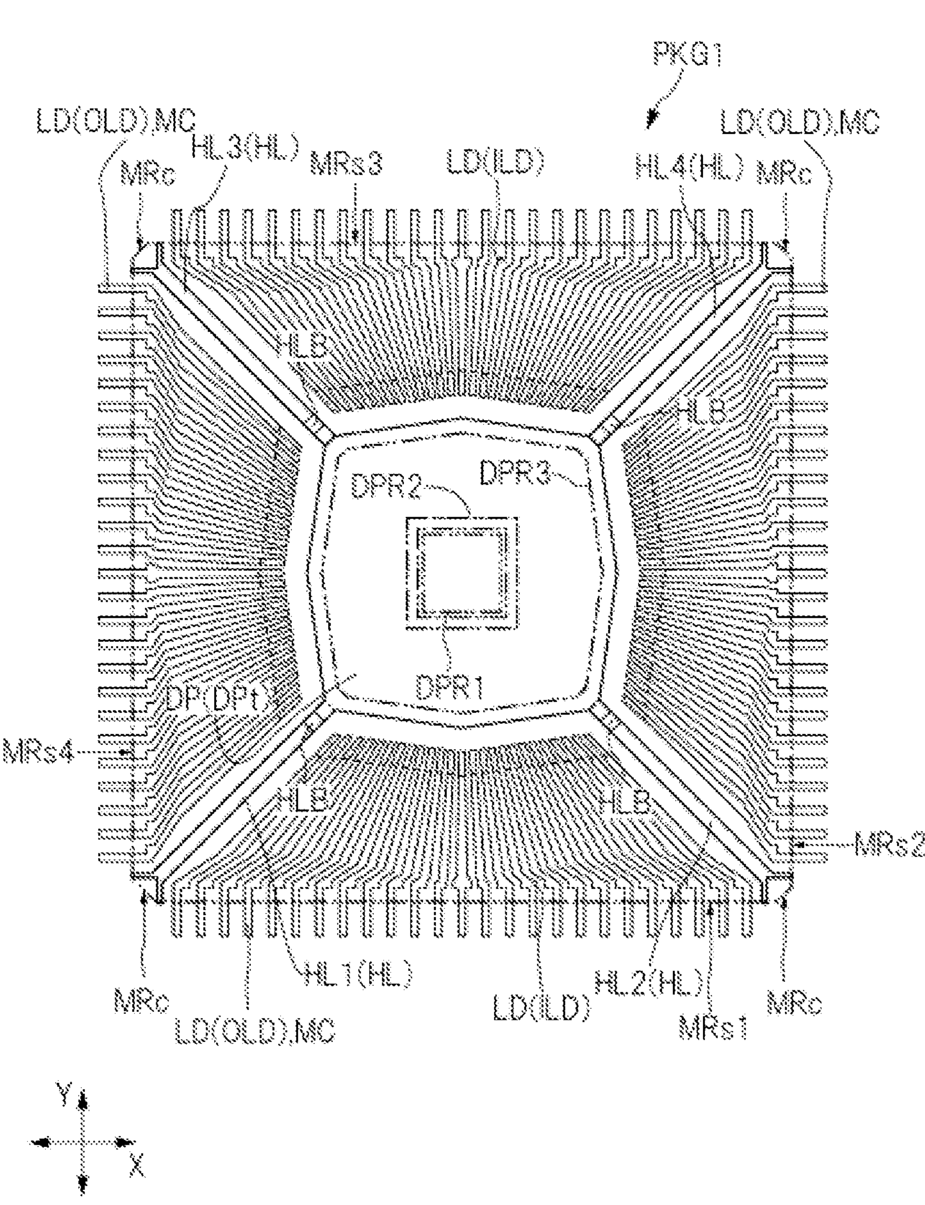
FIG. 4 is a plan view showing a state that a semiconductor chip, a plurality of wires and a metal film formed on a die pad shown in FIG. 3 are removed.

First, an outline of the configuration of a semiconductor device PKG1 of the present embodiment will be described with reference to FIG. 1 through FIG. 4. FIG. 1 is an upper surface view of the semiconductor device according to the present embodiment. FIG. 2 is a cross-sectional view taken along a line A-A shown in FIG. 1. FIG. 3 is a perspective plan view of FIG. 1. FIG. 4 is a plan view showing a state that a semiconductor chip and a plurality of wires shown in FIG. 3 are removed.

As shown in FIGS. 1 to 4, the semiconductor device PKG1 includes a die pad DP (see FIGS. 2 and 3), a semiconductor chip CP (see FIGS. 2 and 3), a plurality of leads LD, and a plurality of wires BW (see FIG. 2). The semiconductor chip CP, the plurality of wires BW and the die pad DP are sealed with a sealing body (resin body) MR. An inner lead portion ILD of each of the plurality of leads LD is sealed with the sealing body MR, and an outer lead portion OLD of each of the plurality of leads LD is exposed from the sealing body MR.

As shown in FIG. 1, the planar shape of the sealing body MR included in the semiconductor device PKG1 is a quadrilateral shape. The sealing body MR has an upper surface MRt, a lower surface (back surface, mounted surface) MRb (see FIG. 2) located opposite upper surface MRt, and a side surface located between upper surface MRt and the lower surface MRb.

As shown in FIGS. 1 and 3, the sealing body MR has a side (main side) MRs1 extending along the X direction and a side (main side) MRs2 extending along the Y direction intersecting (perpendicular in FIG. 1) the X direction in a plan view. The sealing body MR has a side MRs3 located on the opposite side of the side MRs1 and extending along the X direction, and a side MRs4 located on the opposite side of the side MRs2 and extending along the Y direction. As shown in FIG. 1, the four side surfaces of the sealing body MR are arranged along the respective sides of the sealing body MR.

The corner portion MRc of the sealing body MR includes a peripheral area of a corner which is an intersection point of any two intersecting sides (two main sides) among the four sides (four main sides) of the sealing body MR. Incidentally, strictly, as shown in FIGS. 1 and 3, the corner MRc of the sealing body MR, since the tapered shape does not include the intersection points of the four main variations themselves described above, the intersection point of the main side is disposed on the outer side than the corner MRc of the sealing body MR. However, since the size of the corner portion MRc is sufficiently smaller than the length of the main side, the center of the corner portion MRc is regarded as the corner of the sealing body MR in the present application.

In the semiconductor device PKG1, a plurality of leads LD are arranged along respective sides (respective main sides) of the sealing body MR having a rectangular planar shape. Each of the plurality of leads LD is made of a metal material, and in the present embodiment, a metal member made of, for example, copper or a copper alloy.

As shown in FIG. 2, the outer lead portions OLD of the plurality of leads LD protrude from the inside of the sealing body MR toward the outside on the side surface of the sealing body MR. In addition, a metal film (exterior plating film) MC is formed on the exposed surface of the outer lead portion OLD of the plurality of leads LD, for example, on the surface of a base material containing copper as a main component. The metal film MC is, for example, a metal film made of a metal material having better wettability to solder than copper as a base material, such as solder, and covering the surface of the copper member as a base material. When the semiconductor device PKG1 is mounted on the mounting substrate by forming a metal film MC made of solder or the like on each of the outer lead portions OLD of the plurality of leads LD serving as external terminals of the semiconductor device PKG1, the wettability of the solder material serving as the conductive connecting material can be improved. As a result, the bonding area between the plurality of leads LD and the solder material is increased, so that the bonding strength between the plurality of leads LD and the mounting substrate terminal can be improved.

The metal film MC is, for example, a solder material made of so-called lead-free solder that is substantially free of lead (Pb) containing Sn—Pb solder material or Pb. Examples of lead-free solders include, for example, tin (Sn), tin-bismuth (Sn—Bi), tin-copper-silver (Sn—Cu—Ag), tin-copper (Sn—Cu), and the like. Here, the lead-free solder means that the content of lead (Pb) is 0.1 wt % or less, this content is defined as a standard of RoHS (Restriction of Hazardous Substances) directive.

As shown in FIG. 3, a semiconductor chip CP is sealed inside the sealing body MR. As shown in FIG. 3, the semiconductor chip CP has a quadrangular shape in a plan view, and a plurality of electrode pads (electrodes) PD (see FIG. 2) are provided on the surface CPt along each of four sides constituting the outer edge of the surface CPt. Further, the semiconductor chip CP (specifically, semiconductor substrate) is made of, for example, silicon (Si). Although not shown, a plurality of semiconductor elements (circuit elements) are formed in a main surface of the semiconductor chip CP (specifically, in a semiconductor element forming area on upper surface of semiconductor substrate included in the semiconductor chip CP). The plurality of electrode pads PD are electrically connected to the semiconductor element via wirings (not shown) formed in the wiring layers disposed inside the semiconductor chip CP (specifically, between the surface CPt and the semiconductor element forming regions (not shown)). In other words, the plurality of electrode pads PD are electrically connected to a circuit formed in the semiconductor chip CP.

As shown in FIG. 2, the semiconductor chip CP has a surface (main surface, back surface, and bottom surface) CPb and a surface (main surface, front surface, upper surface) CPt opposed to the surface CPb. The plurality of electrode pads PD are arranged on the surface CPt of the semiconductor chip CP.

Specifically, an insulating film covering substrate and the wire of the semiconductor chip CP is formed on the surface CPt of the semiconductor chip CP, and the respective surfaces of the plurality of electrode pads PD (see FIG. 2) are exposed from the insulating film in the opening formed in the insulating film. In addition, the electrode pad PD is made of a metal. In the present embodiment, for example, it is made of aluminum (Al).

Further, as shown in FIG. 3, a plurality of leads LD is arranged around the die pad DP. The electrode pad PD (see FIG. 2) on the surface CPt of the semiconductor chip CP is electrically connected to the inner lead portion ILD of the lead LD located inside the sealing body MR via a wire (conductive member) BW. The wire BW is made of, for example, gold (Au) or copper (Cu), a part of the wire BW (e.g., one end) is bonded to the electrode pad PD, and the other part (e.g., the other end) is bonded to a wire bonding region (a region where a part of the wire BW is connected) of the distal end portion of the inner lead portion ILD.

In addition, a metal film (plating film, plating metal film) MFL (refer to FIG. 2) is formed in a wire bonding area at a distal end portion of the inner lead portion ILD. As shown in FIG. 2, a metal film MFL is partially formed on a portion of the inner lead portion ILD (upper surface (front LDt) of the front end portion closest to the die pad DP). The metal film MFL is made of, for example, silver (Ag) as a main component. In the inner lead portion ILD, the bonding strength with a wire BW made of gold or copper can be improved by forming a metal film MFL made of a silver-based material at a part where the wire BW is connected.

In the semiconductor device PKG1, a part of the plurality of wires BW is connected to the die pad DP and the semiconductor chip CP. Other portions of the plurality of wires BW are connected to the die pad DP and the lead LD. The region of the die pad DP to which the wire BW is connected will be described later.

As shown in FIG. 2, the semiconductor chip CP is mounted on a die pad DP which is a chip mounting portion. The die pad DP has an upper surface (main surface, chip-mounting surface) DPt and a lower surface (main surface, back surface) DPb opposite the upper surface DPt. The semiconductor chip CP is mounted on the upper surface DPt of the die pad DP. The semiconductor chip CP is mounted in a region (a chip mounting region and a die bonding region) DPR1 (refer to FIG. 4) of the upper surface DPt of the die pad DP. The region DPR1 is an area including the center of the upper surface DPt of the die pad DP. The contour of the region DPR1 coincides with the contour of the semiconductor chip CP in plan view. In the embodiment shown in FIG. 3, upper surface DPt of the die pad DP is octagonal. The die pad DP is a support member that supports the semiconductor chip CP, and has various modified example other than those shown in FIG. 4. For example, the planar shape of the die pad DP may be a polygon having a quadrangle shape or more.

Further, as shown in FIG. 2, the semiconductor chip CP is mounted on the die pad DP with the surface CPb facing upper surface DPt of the die pad DP via a die bonding material (adhesive material) DB. This is mounted by a so-called face-up mounting method in which the opposing surface (surface CPb) of the surface CPt on which the plurality of electrode pads PD is formed is opposed to the chip-mounting surface (upper surface DPt). The die bonding material DB is an adhesive material for die bonding the semiconductor chip CP, for example, an epoxy-based thermosetting resin, a resin adhesive containing metal particles made of silver or the like, or a metal bonding material such as a solder material is used.

For present embodiment, the area of upper surface DPt of the die pad DP shown in FIG. 3 is larger than the area of the surface CPt of CP. For example, the surface CPt of the semiconductor chip CP is comprised of a square shape having a side whose length is about 2 mm. The upper surface DPt of the die pad DP has a regular octagon shape in which the length of each of the plurality of diagonal lines is 8 mm. The area of upper surface DPt of the die pad DP is about 11.3 times the area of the surface CPt of the semiconductor chip CP. In the above description, the area of the upper surface DPt is used, but the area of the lower surface DPb is the same as the area of the upper surface DPt.

As described above, the die pad DP has improved heat dissipation when upper surface DPt and the lower surface DPb of the die pad CP have an area of 8 times or more with respect to the plane of the semiconductor chip DPt. In particular, for present embodiment, the die pad DP is entirely sealed to the sealing body MR, including the upper surface DPt and lower surface DPb. In other words, each of the upper surface DPt and lower surface DPb of the die pad DP is not exposed from the sealing body MR. As described above, when the entire die pad DP is a sealed type of semiconductor device, the heat dissipation performance needs to be improved as compared with a type of semiconductor device in which a portion of the die pad DP is exposed from the sealing body MR. Increasing upper surface DPt and lower surface DPb of the die pad DP is particularly effective from the viewpoint of improving heat dissipation.

In addition, the large area of upper surface DPt of the die pad DP is preferable from the viewpoint of the general-purpose versatility of the lead frame. That is, the area of the surface CPt of the semiconductor chip CP shown in FIG. 3 is 0.1 times or less of the area of upper surface DPt of the die pad DP, when the area of upper surface DPt of the die pad DP is sufficiently large, it is possible to mount the semiconductor chip of various planar sizes. Consequently, the general-purpose versatility of the lead frame including the die pad DP is improved.

When a semiconductor chip larger than the semiconductor chip CP is mounted on the die pad, the position where the metal film MF1 is formed needs to be changed so that the metal film MF1 is not covered with the semiconductor chip. When a semiconductor chip smaller than the semiconductor chip CP is mounted, if it is desired to shorten the length of the wire BW1 to be described later, the position where the metal film MF1 is to be formed needs to be changed. However, in both cases, the position where the metal film MF1 is formed can be changed if the mask for forming the metal film MF1 is changed, so that the same lead frames can still be used.

As shown in FIG. 4, the upper surface DPt of the die pad DP includes a region DPR1, a region DPR2 surrounding the region DPR1 in a plan view, and a region DPR3 surrounding the region DPR2 in the plan view. The region DPR1 is a region in which the semiconductor chip CP (see FIG. 3) is mounted as described above. The region DPR2 is a region in which the metal film MF1 (refer to FIG. 3) is disposed. The region DPR2 is a region in a frame shape continuously surrounding the region DPR1. The region DPR3 is a region in which the metal film MF2 (refer to FIG. 3) is disposed. The region DPR3 is a region in a frame shape continuously surrounding the region DPR2. The region DPR3 also includes an outer edge of the upper surface DPt of the die pad DP.

As shown in FIG. 4, a plurality of suspension leads HL extending from the peripheral edge portion of the die pad DP toward the peripheral edge portion of the sealing body MR is disposed around the die pad DP. The suspension lead HL is a member in a manufacturing process of the semiconductor device PKG1 for supporting the die pad DP on a support portion (frame portion) of a lead frame, and one end portion of the suspension lead HL is connected to the die pad DP. In the embodiment shown in FIG. 4, four suspension leads HL1, HL2, HL3, HL4 extending from a portion of the die pad DP toward each of the four corner MRc of the sealing body MR are connected to the die pad DP. A lead group including a plurality of leads LD is disposed between the suspension lead HL1 and the suspension lead HL2.

Specifically, one end portion of each of the plurality of suspension leads HL is connected to a corner portion (corner) of the die pad DP. The other end portion of each of the plurality of suspension leads HL extends toward the respective corner portion MR of the sealing body MRc, is divided into two pieces in the vicinity of the corner portion MRc, and is exposed from the sealing body MR (see FIG. 1) at the side surface of the sealing body MR.

Further, in the present embodiment, as shown in FIG. 2, the upper surface DPt of the die pad DP and the upper surface of the inner lead portion ILD of the lead LD are arranged at different heights from each other. In the embodiment shown in FIG. 2, the upper surface DPt of the die pad DP is disposed at a lower position than the position of the upper surface LDt of the inner lead portion ILD. For this reason, in the plurality of suspension leads HL shown in FIG. 3, an offset portion (a bent portion, in the case of the present embodiment, a downset portion) HLB that is bent so that the height of the upper surface DPt of the die pad DP is positioned at a height that differs from the upper surface LDt (refer to FIG. 2) of the inner lead portion ILD of the lead LD is provided.

Further, as shown in FIG. 2, each of the semiconductor chip CP, the die pad DP, the plurality of wires BW, and the plurality of leads LD is sealed with a sealing body MR. Specifically, the semiconductor chip CP, the die pad DP and the plurality of wires BW are entirely sealed with the sealing body MR. Further, a portion (inner lead portion ILD) of each of the plurality of leads LD is sealed with the sealing body MR, and the other portion (outer lead portion OLD) is exposed from the sealing body MR.

Details Around Die Pad

Figure 5:
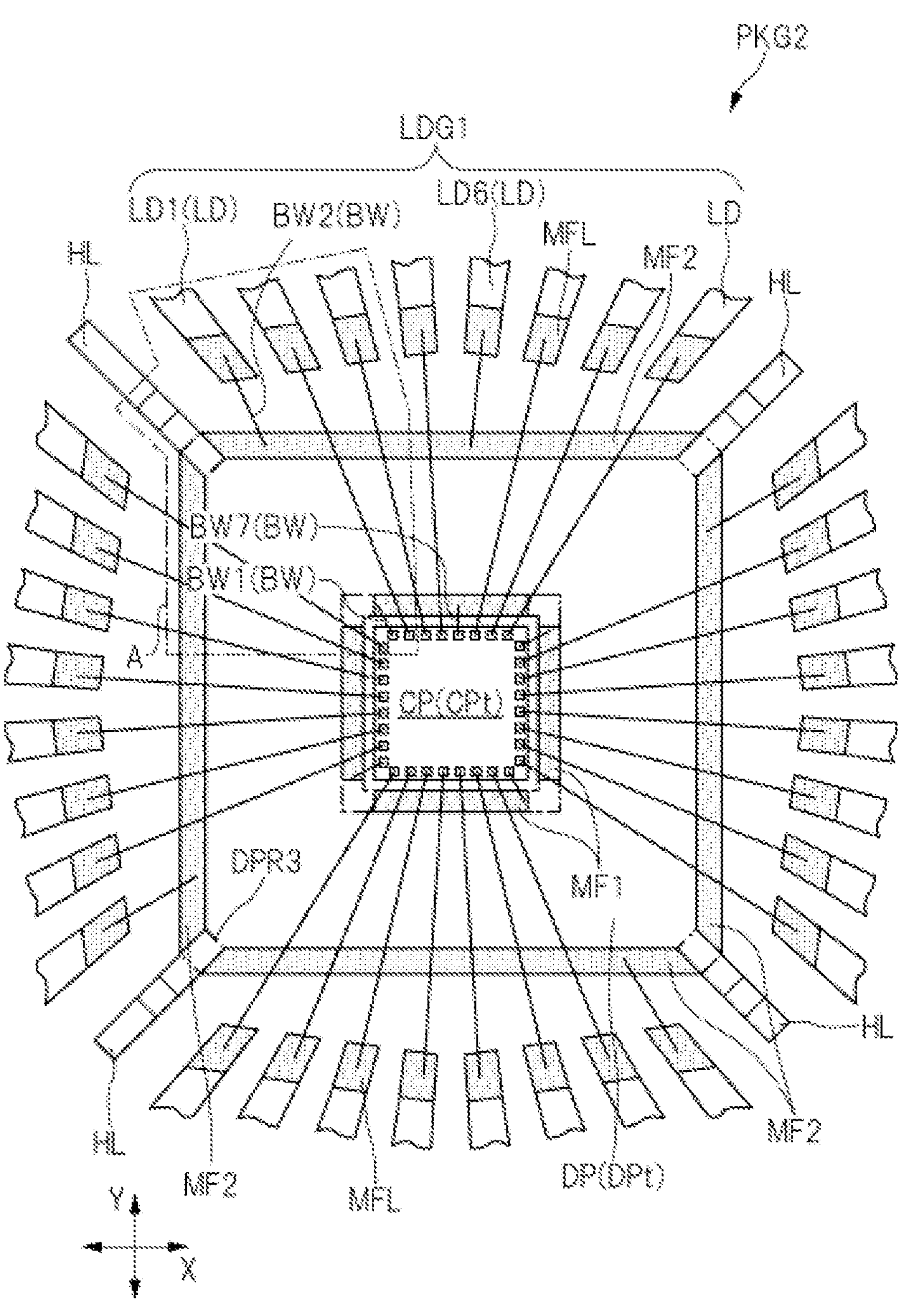
FIG. 5 is an enlarged plan view of a model that a structure around the die pad shown in FIG. 3 is simplified.
Figure 6:
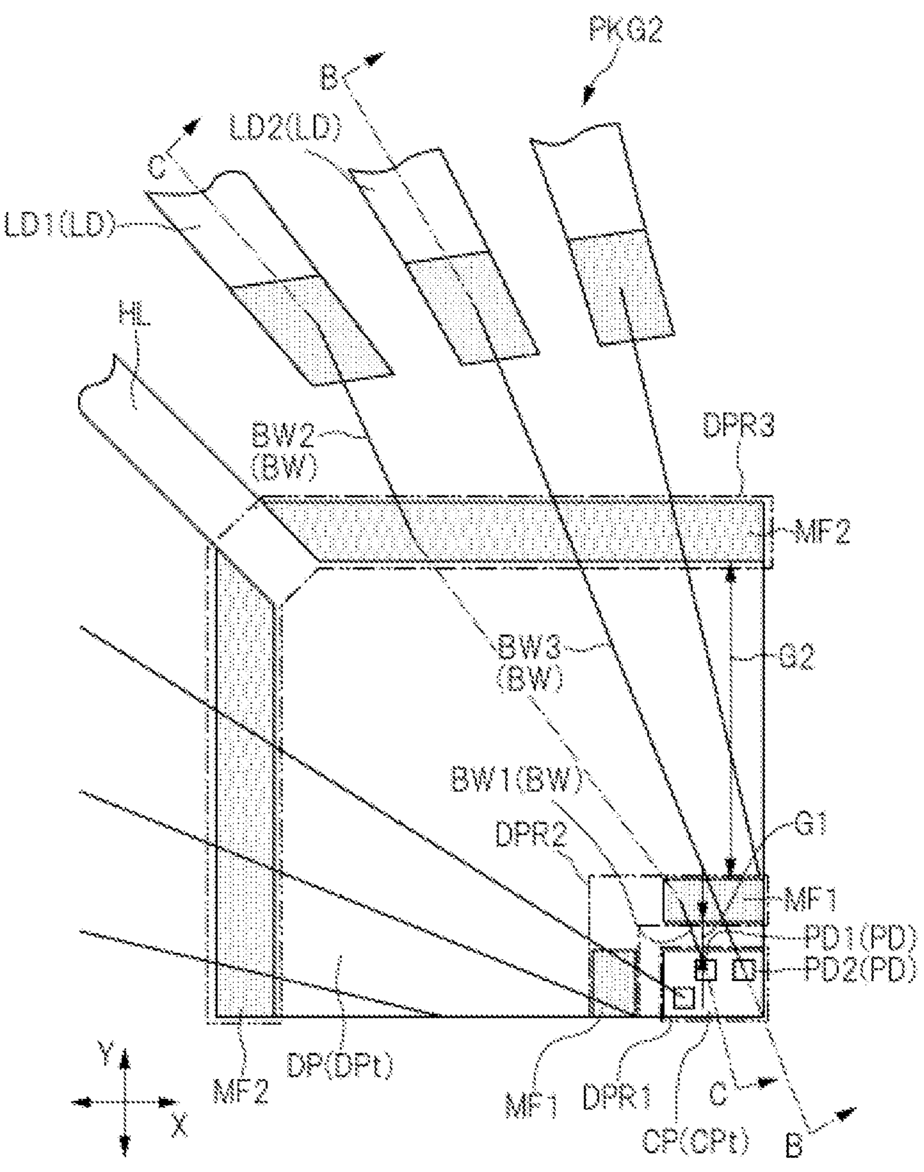
FIG. 6 is an enlarged plan view at a portion A shown in FIG. 5.
Figure 7:
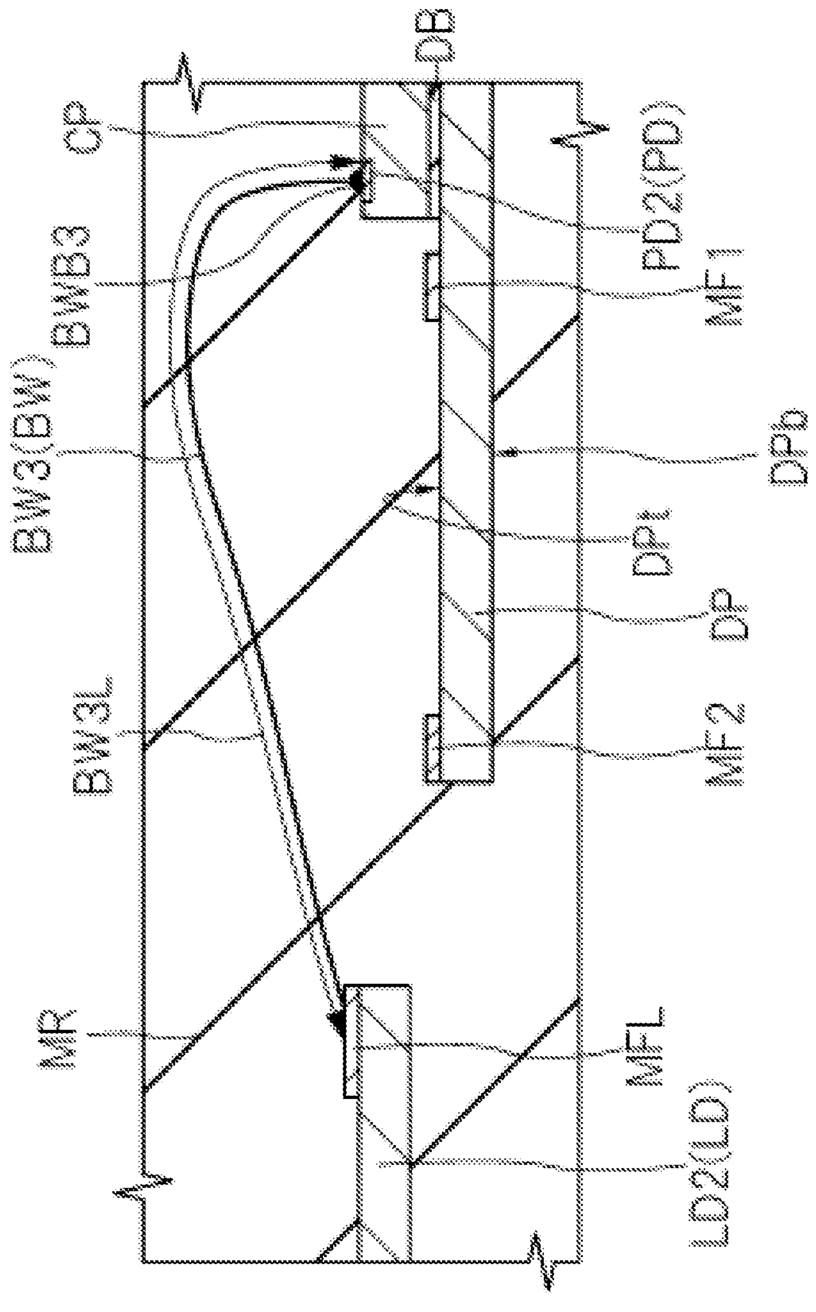
FIG. 7 is an enlarged cross-sectional view taken along a line B-B shown in FIG. 6.
Figure 8:
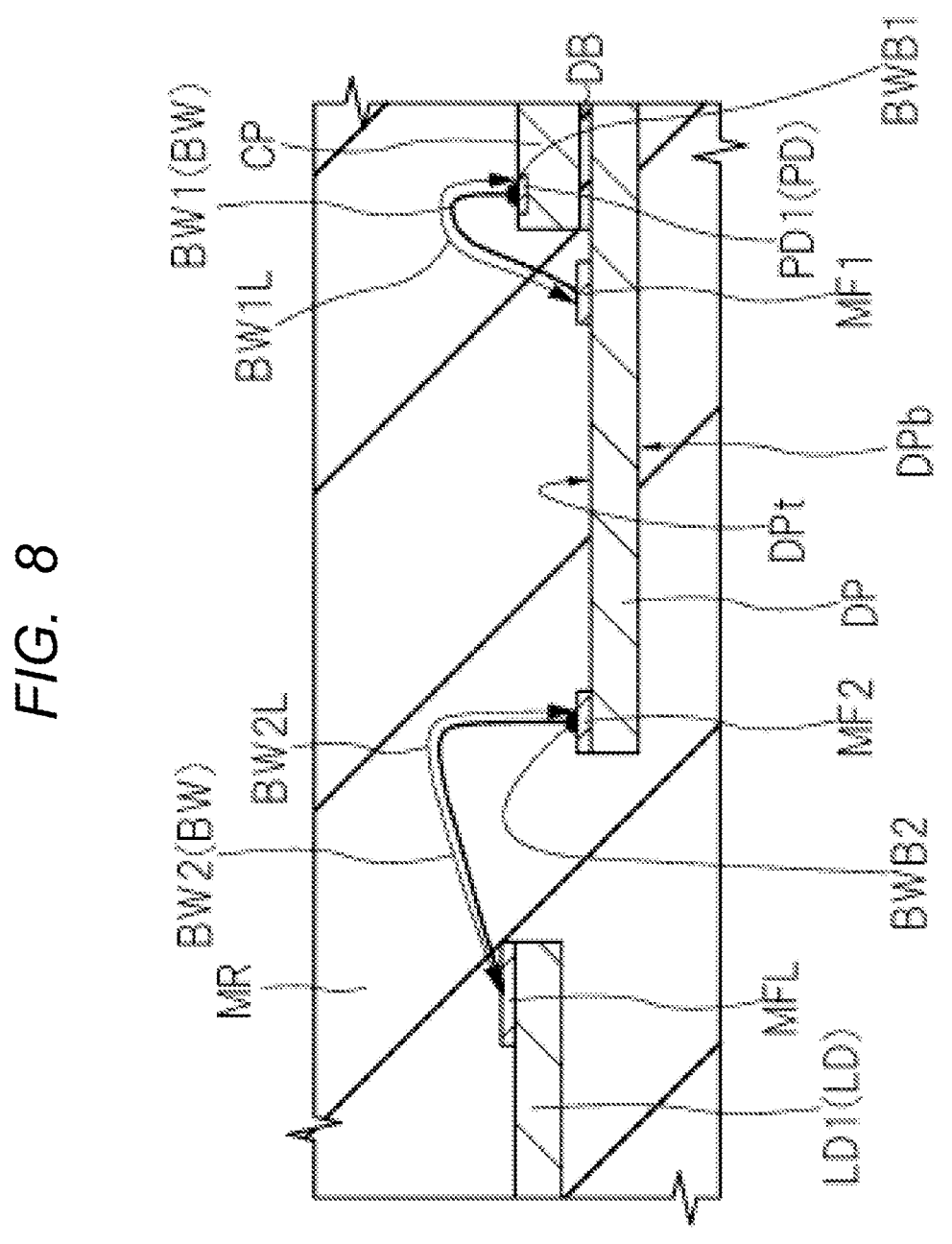
Figure 9:
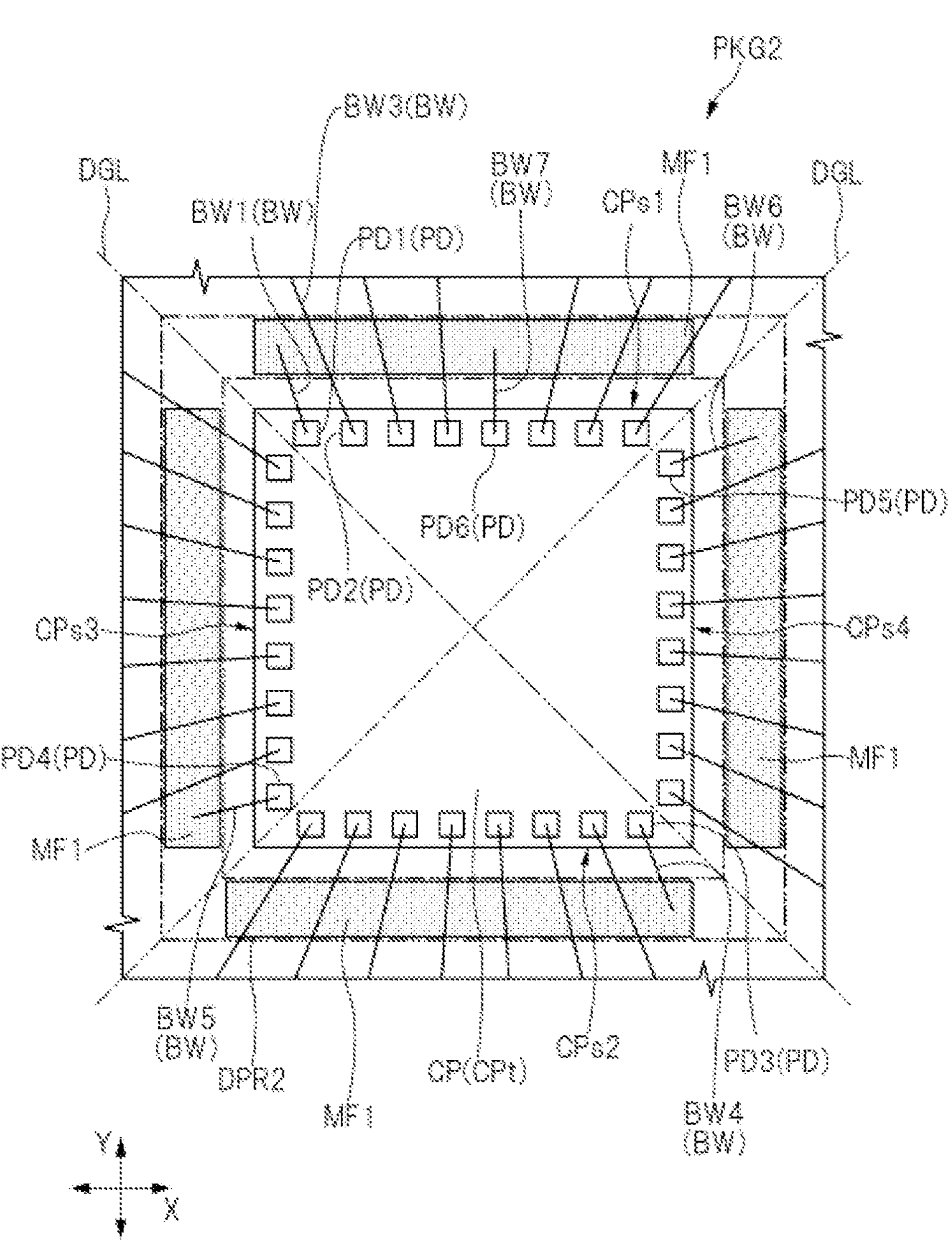
FIG. 9 is an enlarged plan view of the die pad shown in FIG. 5 at around the semiconductor chip.

Next, the peripheral configuration of the die pad DP shown in FIGS. 2 to 4 will be described. In the following, in order to facilitate identification of each part of the semiconductor device PKG1, the shape of the die pad DP, the shape and the number of the plurality of leads LD, the number of the plurality of wires BW, and the size and the number of the plurality of electrode pads PD will be described using a simplified structure. FIG. 5 is an enlarged plan view of a model that a structure around the die pad shown in FIG. 3 is simplified. FIG. 6 is an enlarged plan view at a portion A shown in FIG. 5. FIG. 7 is an enlarged cross-sectional view taken along a line B-B shown in FIG. 6. FIG. 8 is an enlarged cross-sectional view taken along a line C-C shown in FIG. 6. FIG. 9 is an enlarged plan view of the die pad shown in FIG. 5 at around the semiconductor chip.

A semiconductor device PKG2 shown in FIGS. 5 to 9 is similar to the semiconductor device PKG1 shown in FIGS. 1 to 4, except that the planar shape of the die pad DP is a quadrangle shape, the number of leads LD, the number of wires BW, and the number of electrode pads are reduced. Therefore, in the following description, the description may be made with reference to FIG. 1 through FIG. 4 as necessary. The techniques described below are also applicable to the semiconductor device PKG1 shown in FIGS. 1 to 4.

The semiconductor device PKG2 shown in FIGS. 5 to 9 includes a die pad DP, a semiconductor chip CP, a plurality of leads LD, a plurality of wires BW, a metal film MF1, a metal film MF2, and a sealing body MR (see) as in the semiconductor device PKG1 shown in FIGS. 1 to 4. The die pad DP has an upper surface DPt including a region DPR1, a region DPR2 surrounding the region DPR1, and a region DPR3 surrounding the region DPR2. The semiconductor chip CP includes a surface CPb facing the upper surface DPt (refer to FIG. 2), a surface CPt opposite the the surface CPb, and a plurality of electrode pads PD arranged on the surface CPt. The semiconductor chip CP is mounted on the die pad DP at the region DPR1. The plurality of leads LD is arranged around the die pad DP. The plurality of wires BW electrically connects the plurality of electrode pads PD with the plurality of leads LD, respectively. The metal film MF1 is provided in the region DPR2 of the upper surface DPt of the die pad DP. The metal film MF2 is provided in the region DPR3 of the upper surface DPt of the die pad DP. The metal film MF2 is electrically connected with the metal film MF1 through the die pad DP.

In a plan view, the semiconductor chip CP, the metal film MF1 and the metal film MF2 are separated apart from one another. The plurality of wires BW includes a wire BW1 and a wire BW2. The wire BW1 is bonded to each of the electrode pad PD1 of the plurality of electrode pads PD and the metal film MF1. The wire BW2 is bonded to each of the lead LD1 of the plurality of leads LD and the metal film MF2.

As described above, the heat dissipation effect due to the die pad DP can be improved when an area (planar size) of the die pad DP (namely, upper surface DPt and/or lower surface DPb) is equal to or greater than 8 times of an area (planar size) of the semiconductor chip.

However, when the planar area of the die pad DP (the area of upper surface DPt) is large, the following problems arise. That is, the length of the wire BW is increased by the distance from the electrode pad PD of the semiconductor chip to the lead LD. For example, in the embodiment illustrated in FIG. 6, the plurality of wires BW further includes a wire BW3 that electrically connects the electrode pad PD2 with the lead LD2 without through the die pad DP. The wire BW3 is bonded to each of the electrode pad PD2 of the plurality of electrode pads PD and the lead LD2 of the plurality of leads LD. The total length BW3L of the wire BW3 (refer to FIG. 7) is, for example, about 4 nm to 6 mm. As described above, the surface CPt of the semiconductor chip CP shown in FIG. 3 is comprised of a square shape having a side whose length is about 2 mm, and thus, the total length BW3L of the wire BW3 is about 2 to 3 times of the length of the side of the semiconductor chip CP. Note that the "total length of the wire" means not the length of the wire in the plan view shown in FIG. 6, but means the total length along the loop-shape of the wire BW as shown in FIGS. 7 and 8.

The wire BW is made of a thin metallic wire. In the current path from the lead LD to the electrode pad PD of the semiconductor chip CP, the wire BW has the largest impedance. Therefore, from the viewpoint of reducing the impedance of the current path, it is preferable to shorten the total length of the wire BW.

In the present embodiment, as shown in FIGS. 6 and 8, the electrode pad PD1 and the lead LD1 are electrically connected with each other through the die pad DP and the two wires BW1,BW2. In order to shorten the total length BW1L of the wire BW1, the metal film MF1 to which one end portion of the wire BW1 is bonded is provided close to the semiconductor chip CP. In the plan view shown in FIG. 6, the distance G1 between the metal film MF1 and the semiconductor chip CP is, for example, less than 1 mm (about several hundred micrometers). Consequently, the total length BW1L of the wire BW1 is less than half (more specifically, less than ⅓) of the total length BW3L of the wire BW3 shown in FIG. 7, and is, for example, about several hundred micrometers to 1 mm.

In addition, in the present embodiment, in order to shorten the total length BW2L of the wire BW2, the metal film MF2 to which one end portion of the wire BW2 is bonded is provided close to the lead LD2. In the plan view shown in FIG. 6, the distance between the lead LD2 and the die pad DP is about 1 mm to 1.5 mm. The metal film MF2 is formed along the outer edge of the die pad DP. Therefore, the distance between the lead LD2 and the metal film MF2 is about 1 mm to 1.5 mm as well as the distance between the lead LD2 and the die pad DP. Consequently, the total length BW2L of the wire BW2 is less than half (more specifically, less than ⅓) of the total length BW3L of the wire BW3 shown in FIG. 7, and is, for example, about 1 mm to 2 mm.

For the present embodiment, the total length BW1L of the wire BW1 is shorter than the total length BW2L of the wire BW2. This is because the separation distance G1 between the metal film MF1 and the semiconductor chip CP is more likely to be shorter than the separation distance between the lead LD2 and the metal film MF2. In order to shorten each of the separation distance G1 between the metal film MF1 and the semiconductor chip CP and the separation distance between the lead LD2 and the metal film MF2, as in the present embodiment, the total length BW1L of the wire BW1 is often shorter than the total length BW2 of the wire.

As described above, in the present embodiment, the total length of each of the wire BW1 and the wire BW2 is reduced by interposing the die pad DP in the path electrically connected with each of the electrode pad PD1 and the lead LD1. For example, the sum of the total length BW1L of the wire BW1 and the total length BW2L of the wire BW2 is about 2 mm to 2.5 mm, and is shorter than the total length BW3L of the wire BW3 shown in FIG. 7. Further, since the die pad DP interposed in the current path has a large path cross-sectional area, the impedance of the die pad DP as the current path is smaller than each of the impedance of the wire BW1 and the impedance of the wire BW2. Therefore, the impedance of the current path through the wire BW1 and the wire BW2 shown in FIG. 6 is lower than the impedance of the current path through the wire BW3.

There are various types of currents flowing through the low impedance current path (i.e., the path including the lead LD1), and modified example, for example, the following can be cited. For example, the lead LD1 shown in FIG. 6 may be used as a path for supplying a signal. In the signal transmission path, since the total length of each of the wire BW1 and the wire BW2 is shortened, the signal can be suppressed from being reflected or the like, the quality of the transmitted signal (signal waveform) can be improved.

As another example, the lead LD1 shown in FIG. 6 may be used as a path for supplying a power supply potential or a reference potential to the semiconductor chip CP. When the lead LD1 is included in a current path to which a fixed potential such as the power supply potential or the reference potential is to be supplied, it is possible to stabilize the power for driving the circuit included in the semiconductor chip CP by reducing the impedance of the current path. For example, when the impedance of the path for supplying the power supply potential or the reference potential is large, the driving voltage may instantaneously drop due to the influence of the impedance. In the present embodiment, since the impedance of the path for supplying the power supply potential or the reference potential can be improved, the generation of a voltage drop can be suppressed.

When the die pad DP is used as a path for supplying a power supply potential or a reference potential, two or more wires BW may be connected to the metal film MF1. For example, in case of the semiconductor device PKG2 shown in FIG. 9, two or more wire BW (wire BW1, wire BW4, wire BW5, wire BW6, and wire BW7 shown in FIG. 9) of the plurality of wires BW are connected to the metal film MF1. In this case, the impedance of the path for supplying the power supply potential or the reference potential can be further reduced as compared with a case where only one wire BW is connected to the metal film MF1. As a consequence, the power for driving the circuit included in the semiconductor chip CP can be further stabilized.

As shown in FIG. 9, the semiconductor chip CP has four sides in a plan view. Specifically, the semiconductor chip CP has a side CPs1 extending in the X-direction in the plan view, a side CPs2 opposite the side CPs1, a side CPs3 crossing each of the side CPs1 and the side CPs2, and a side CPs4 opposite the side CPs3. The plurality of electrode pads CP of the semiconductor chip PD is arranged along each of the four sides of the semiconductor chip CP. The metal film MF1 is provided along each of the four sides of the semiconductor chip CP. The metal film MF1 extends continuously along each of the four sides of the semiconductor chip CP.

In view of the general-purpose versatility of the die pad DP, it is preferable that the metal film MF1 is provided along each side of the plurality of electrode pads PD included in the semiconductor chip CP. For example, in the embodiment shown in FIG. 9, the plurality of wires BW includes a wire BW1, a wire BW4, a wire BW5, a wire BW6, and a wire BW7 bonded to a metal film MF1. The wire BW1 extends across the side CPs1 in a plan view. The wire BW4 is bonded to each of the electrode pad PD3 and the metal film MF1 of the plurality of electrode pads PD, and extends across the side CPs2. The wire BW5 is bonded to each of the electrode pad PD4 and the metal film MF1 of the plurality of electrode pads PD, and extends across the side CPs3. The wire BW6 is bonded to each of the electrode pad PD5 and the metal film MF1 of the plurality of electrode pads PD, and extends across the side CPs4. The wire BW7 is bonded to each of the electrode pad PD6 and the metal film MF1 of the plurality of electrode pads PD, and extends across the side CPs1.

For the semiconductor device PKG1, the metal film MF1 is provided along each of the four sides of the semiconductor chip CP, so that the wire BW1, wire BW4, wire BW5, wire BW6, and the total length of each of the wire BW7 can be shortened.

Incidentally, in the embodiment shown in FIG. 9, the wire BW7 extends perpendicularly to one of the four sides of the semiconductor chip CP (the side CPs1 in FIG. 9). The total length of the wire BW7 bonded to each of the electrode pad PD6 and the metal film MF1 can be shortest when it extends in a direction perpendicular to the side CPs1. The total length of the wire BW7 is shorter than the total length of the wire BW1 extending in a direction not perpendicular to the side CPs1.

From the viewpoint of preventing a short circuit due to the contacts between the plurality of wires BW, it is preferable that the extending direction of the wire BW has a smaller tilt angle with respect to the extending direction of the wire BW disposed next to each other. In FIG. 9, the electrode pad PD1 to which the wire BW1 is connected is disposed at an end portion of the array among the plurality of electrode pads PD arranged along the side CPs1. On the other hand, the electrode pad PD6 to which the wire BW7 is connected is arranged at a position closer to the center of the side CPs1 than the electrode pad PD1. An angle at which the edge CPs1 intersects with the electrode pad PD6 is close to 90 degrees around the electrode pad BW arranged at a position close to the center of the edge CPs1. Therefore, the wire BW7 bonded to each of the electrode pad PD6 and the metal film MF1 extends perpendicularly to the side CPs1, but can be prevented from contacting the adjacent wire BW.

In the embodiment shown in FIG. 9, the wire BW1 extends in a direction not perpendicular to the side CPs1 so that the wire BW1 and the wire BW3 do not intersect each other in a plan view. However, as modified example, the wire BW1 may extend in a direction perpendicular to the side CPs1 as in the case of the wire BW7. In this case, depending on the extension of the wire BW3, the wire BW1 and the wire BW3 may intersect each other in a plan view. However, even when the wire BW1 and the wire BW3 intersect each other in a plan view, the wire BW1 and the wire BW3 do not immediately touch each other because the total length of the wire BW1 is sufficiently short as compared with the total length of the wire BW3.

On the other hand, in the electrode group arranged along the side CPs1, when the wire PD1 connected to the electrode pads BW1 arranged at the end of the array extends in a direction perpendicular to the side CPs1, it is preferable that the area of the metal film MF1 can be further reduced.

Countermeasure for Peeling Between Sealing Body and Die Pad

As described above, at least upper surface DPt of the die pad DP is sealed by the sealing body MR as shown in FIGS. 7 and 8. That is, the sealing body MR is formed so as to be contacted with at least upper surface DPt of the die pad DP. Each of the metal film MF1 and the metal film MF2 contacts the sealing body MR. From the viewpoint of suppressing peeling between the sealing body MR and the die pad DP, it is preferable that an area of a part of upper surface DPt covered with the metal film MF1 and the metal film MF2 is small. As described above, the die pad DP is made of copper or a copper alloy, and each of the metal film MF1 and the metal film MF2 is made of silver or gold. Here, the adhesive strength between the sealing body MR and the metal film MF1 (and the metal film MF2) is lower than the adhesive strength between the sealing body MR and upper surface DPt of the die pad DP. Therefore, from the viewpoint of suppressing peeling between the sealing body MR and the die pad DP, the area of the metal film MF1 and the metal film MF2 is preferably smaller.

In the present embodiment, as shown in FIG. 9, the semiconductor chip CP is comprised of the quadrangle shape in a plan view. In addition, the metal film MF1 is provided along each side of the semiconductor chip CP in a plan view. In other words, in the present embodiment, a plurality of metal films MF1 is provided on the upper surface DPt of the die pad DP. Specifically, one of the plurality of metal films MF1 extends along the side CPs1 of the semiconductor chip CP, the other one extends along the side CPs2 of the semiconductor chip CP, the other one extends along the side CPs3 of the semiconductor chip CP, and the other one extends along the side CPs4 of the semiconductor chip CP. In a plan view, each of the plurality of metal films MF1 is spaced apart from each other at a position overlapping at least any one extended line of the two diagonal lines DGL of the surface CPt of the semiconductor chip CP.

Note that the plurality of metal films MF1 shown in FIG. 9 are metal films independent of each other, and thus can be expressed as follows. That is, the metal film MF1 extending along the side CPs1 of the semiconductor chip CP may be the first metal film, the metal film MF1 extending along the side CP side CPs2 of the semiconductor chip CP may be the third metal film, and the metal film MF1 extending along the side CPs1 of the semiconductor chip CP may be the fifth metal film, the metal film MF1 extending along the side CPs3 of the semiconductor chip CP may be the fourth metal film.

In the following explanation, a region around a position overlapping at least any one extended line of the two diagonal lines DGL in the region DPR2 is referred to as "corner portion" of the region DPR2. The corner portion of the region DPR2 refers to a region of the region DPR2 that does not overlap the side CPs1 and the side CPs2 in the Y direction and does not overlap the side CPs3 and the side CPs4 in the X direction.

Figure 10:
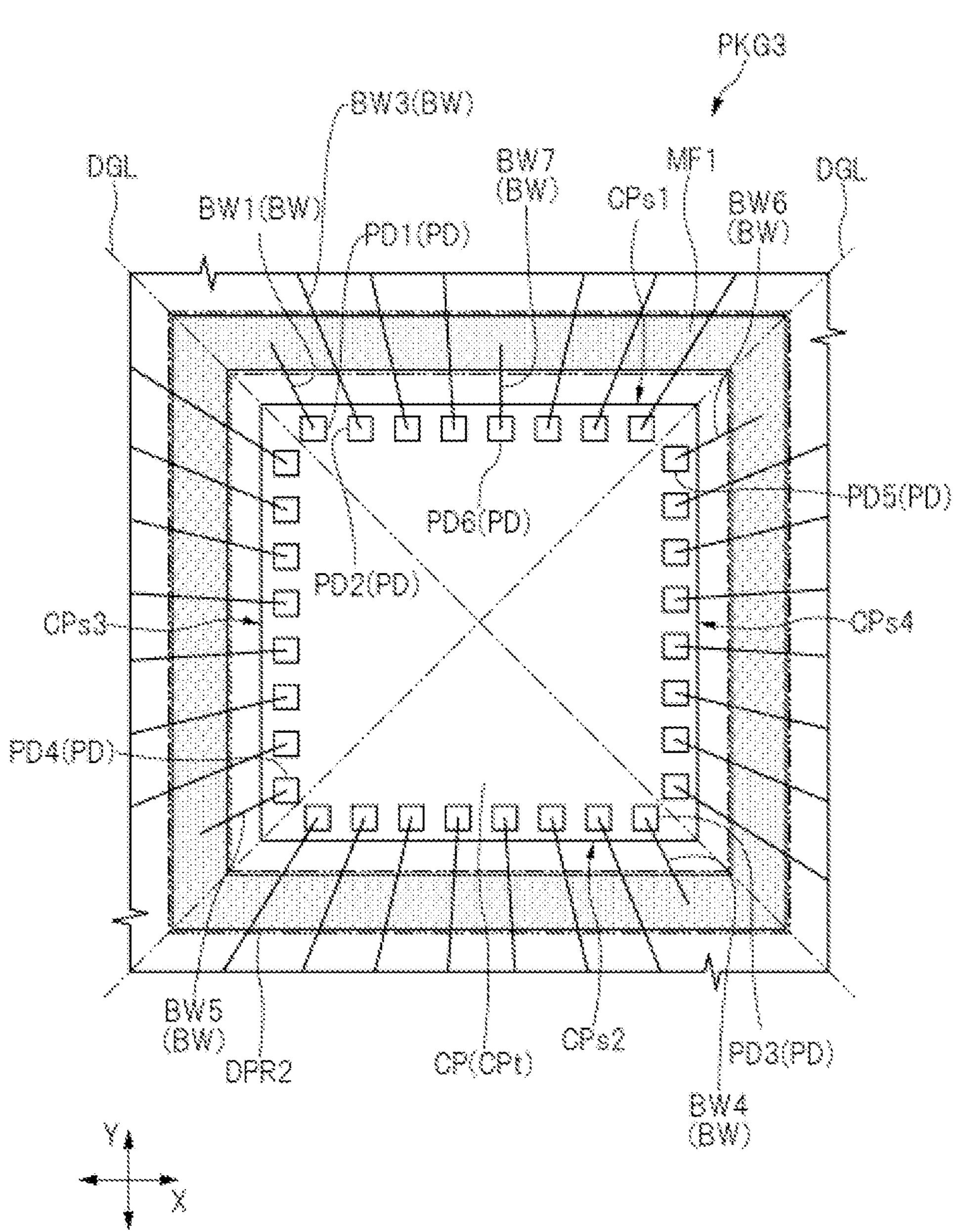
FIG. 10 is an enlarged plan view showing a modified example with respect to FIG. 9.

FIG. 10 is an enlarged plan view showing a modified example with respect to FIG. 9. A semiconductor device PKG3 shown in FIG. 10 is different from the semiconductor device PKG2 shown in FIG. 9 in that the plurality of metal films MF1 shown in FIG. 9 is connected to each other, that is, one metal film MF1 is provided around the semiconductor chip CP so as to surround the semiconductor chip CP. In the case of the semiconductor device PKG2 shown in FIG. 9, since the plurality of metal films MF1 is separated apart from one another, it is possible to prevent the peeling from progressing to another metal film MF1 even when peeling occurs at the interface between the sealing body MR (see FIG. 6) and the metal film MF1 in a part of the plurality of metal films. This is because the progress of peeling of the sealing body MR and the metal film MF1 is limited at the corner portion of the region DPR2 described above.

In addition, even when the general-purpose versatility of the die pad DP is considered, it is unlikely that the wire BW is bonded to the corner portion of the above-described region DPR2 in the region DPR2. As described above, in order to shorten the total length of the wire BW, it is preferable that the angle formed by the wire BW and the side CPs1 is closer to 90 degrees. Therefore, even when the metal film MF1 is not provided at the corner portion of the region DPR2 described above, the flexibility of the position where the wire BW is bonded is hardly inhibited.

The semiconductor device PKG2 shown in FIG. 9 is preferable from the viewpoint of suppressing the progress of peeling between the sealing body MR (see FIG. 6) and the metal film MF1 as compared with the semiconductor device PKG3 shown in FIG. 10. Further, in the semiconductor device PKG2 shown in FIG. 9, each of the plurality of parts of the metal film MF1 is separated from each other at a position overlapping at least any one extended line of the two diagonal lines DGL of the surface CPt of the semiconductor chip CP, so that the general-purpose versatility of the die pad DP is hardly hindered.

The semiconductor device PKG3 shown in FIG. 10 is the same as the semiconductor device PKG2 shown in FIG. 9 except for the above-mentioned differences. Therefore, duplicate explanation of the semiconductor device PKG3 will be omitted.

Although the advantages of the metal film MF1 having a plurality of parts spaced apart from each other have been described with reference to FIGS. 9 and 10, the same applies to the metal film MF2 shown in FIG. 5. In the semiconductor device PKG2 shown in FIG. 5, a plurality of suspension leads HL (four in FIG. 5) is connected to the die pad DP. The metal film MF2 has a plurality of parts. In a plan view, the plurality of parts of the metal film MF2 are spaced apart from one another at a position overlapping at least any one extended line of the plurality of suspension leads HL.

Figure 11:
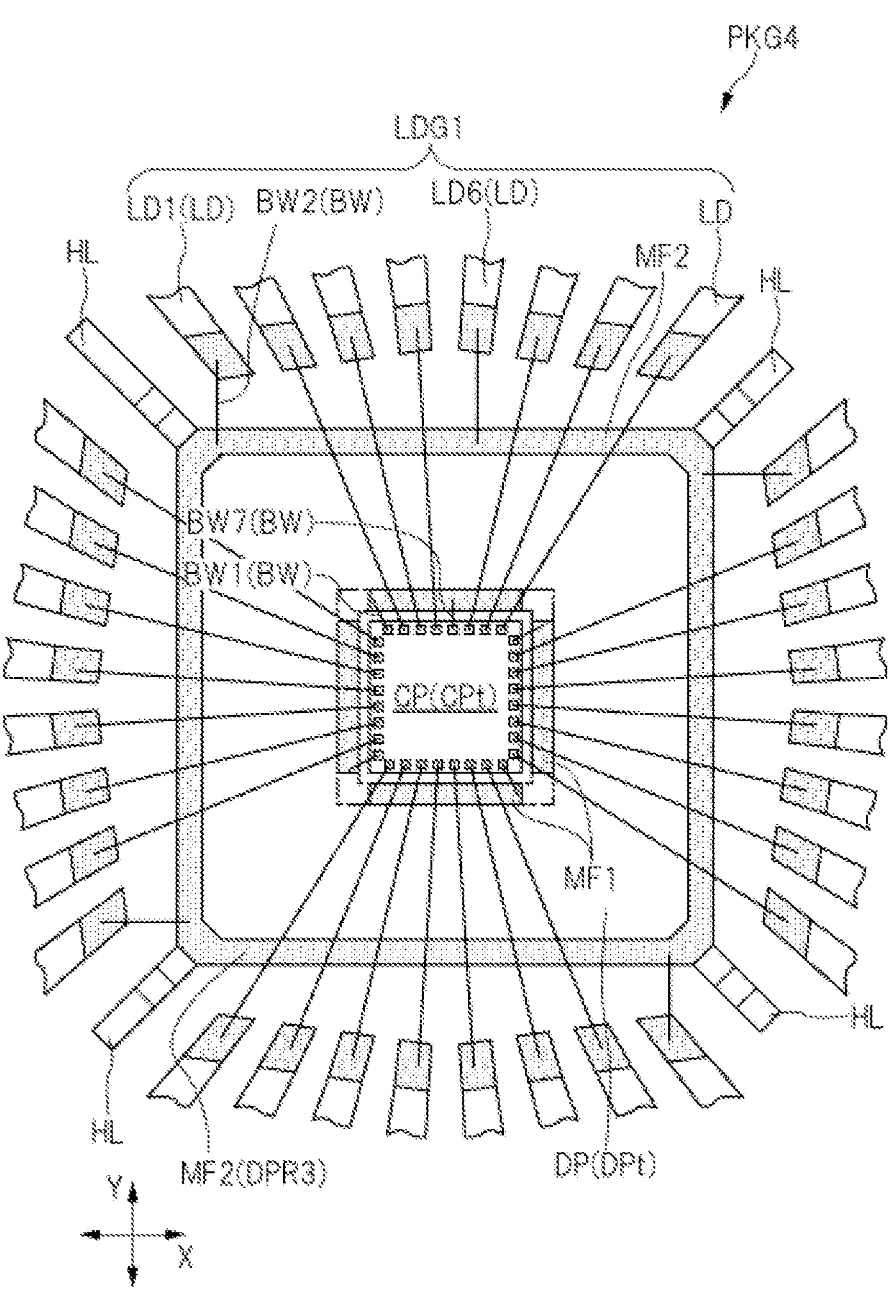
FIG. 11 is an enlarged plan view showing a modified example with respect to FIG. 5.

FIG. 11 is an enlarged plan view showing a modified example with respect to FIG. 5. A semiconductor device PKG4 shown in FIG. 11 differs from the semiconductor device PKG2 shown in FIG. 5 in that a plurality of parts of the metal film MF2 provided along the outer edge of the die pad DP is connected to each other. In the case of the semiconductor device PKG2 shown in FIG. 9, since the metal film MF2 includes a plurality of portions spaced apart from each other, even when peeling occurs at the interface between the sealing body MR (see FIG. 6) and the metal film MF2 in a part of the plurality of portions, the peeling can be suppressed from developing over the entire metal film MF2. This is because the progress of peeling of the sealing body MR and the metal film MF2 is limited at a position overlapping at least any one extended line of the plurality of suspension leads HL.

On the other hand, considering the general-purpose versatility of the die pad DP, the semiconductor device PKG4 shown in FIG. 11 may be more advantageous than the semiconductor device PKG2 shown in FIG. 5. The wire BW2 shown in FIG. 11 will be described as an example. In the embodiment shown in FIG. 11, a wire BW2 may be formed so as to extend perpendicularly to a side of the outer edge of the die pad from the viewpoint of shortening the total length of the wire BW2. The total length of the wire BW2 shown in FIG. 11 is shorter than the total length of the wire BW2 shown in FIG. 5. In the semiconductor device PKG4 shown in FIG. 11, one end portion of the wire BW2 is bonded to the vicinity of a position, which is overlapping with an extended line of one suspension lead, in the metal film MF2. Considering the positional accuracy of the wire bonding step, it is preferable that a metal film MF2 is formed around the position where the wire BW2 is bonded. For this reason, in the embodiment shown in FIG. 11, it is preferable that the metal film MF2 is formed at a position overlapping with each extended line of the plurality of suspension leads HL.

The semiconductor device PKG4 shown in FIG. 11 is the same as the semiconductor device PKG2 shown in FIG. 5 except for the above-mentioned differences. Therefore, duplicate explanation of the semiconductor device PKG4 will be omitted.

In the semiconductor device PKG2 illustrated in FIGS. 5 to 9, the total length of the wire BW1 and the total length of the wire BW2 are shortened, and the area of the metal film MF1 and the area of the metal film MF2 are reduced, respectively. That is, as shown in FIG. 6, in a plan view, the separation distance MF1 between the metal film MF2 and the metal film G2 is longer than the separation distance G1 between the metal film CP and the semiconductor chip. In order to shorten the total length of the wire BW1 and the total length of the wire BW2, it is preferable to reduce the separation G1 between the metal film MF1 and the semiconductor chip CP and to form the metal film MF2 on the outer edge of the die pad DP. In addition, from the viewpoint of reducing the area of the metal film MF1 and the area of the metal film MF2, it is preferable that the width of the metal film MF1 (the length in the direction orthogonal to the longitudinal direction) and the width of the metal film MF2 (the length in the direction orthogonal to the longitudinal direction) be made small as long as there is no trouble in wire bonding. Consequently, as shown in FIG. 6, in a plan view, the separation distance G2 is longer than the separation distance G1.

Direction of Wire Bonding

As shown in FIGS. 7 and 8, in case of a bonding process using a wire BW (hereinafter, referred to as "wire bonding"), after one end portion of the wire BW is bonded, the other end portion is bonded. The end portion that is first bonded is referred to as "first bond" and the end portion that is second bonded is referred to as "second bond". The first bond forms a ball-shaped portion (ball portion) by heating the front end of the wire before bonding, and then bonds the ball portion to the bonding portion (for example, an electrode pad PD or the like). On the other hand, the second bond is bonded to the bonded portion (e.g., the metal film MFL on the lead LD) by pressing the wire BW, and then the wire BW is cut. Therefore, the ball portion is not formed in the second bond.

The wire bonding is performed by using a jig called a capillary (not shown). Further, when performing the wire bonding of the plurality of wires BW sequentially as shown in FIG. 5, in each of the multiple times of the wire bonding, it is preferable that the direction from the first bond toward the second bond is aligned. In FIG. 7, the end portion of the wire BW3 that is bonded to the electrode pad PD2 is a first bond, and an end portion of the wire BW3 that is bonded to the metal film MFL is a second bond. Further, in FIG. 8, the end portion of the wire BW1 that is bonded to the electrode pad PD1 is a first bond, and the end portion of the wire BW1 that is bonded to the metal film MF1 is a second bond. Also, the end portion of the wire BW2 that is bonded to the metal film MF2 is a first bond, and the end portion of the wire BW2 that is bonded to the metal film MFL is a second bond. Thus, in the present embodiment, each of the plurality of wires BW has a first bond at a position relatively close to the semiconductor chip CP, and has a second bond at a position relatively far from the semiconductor chip CP. Therefore, in the present embodiment, it can be said that, in each of the multiple times of the wire bonding, the direction from the first bond toward the second bond is aligned.

The above-described configuration can be expressed as follows. That is, the wire BW1 shown in FIG. 8 includes a ball portion BWB1 bonded to the electrode pad PD1. The wire BW2 shown in FIG. 8 includes a ball portion BWB2 bonded to the metal film MF2. Further, the wire BW3 shown in FIG. 7 includes a ball portion BWB3 bonded to the electrode pad PD2.

Modified Example in which Two or More Wires are Bonded to One Lead

Figure 12:
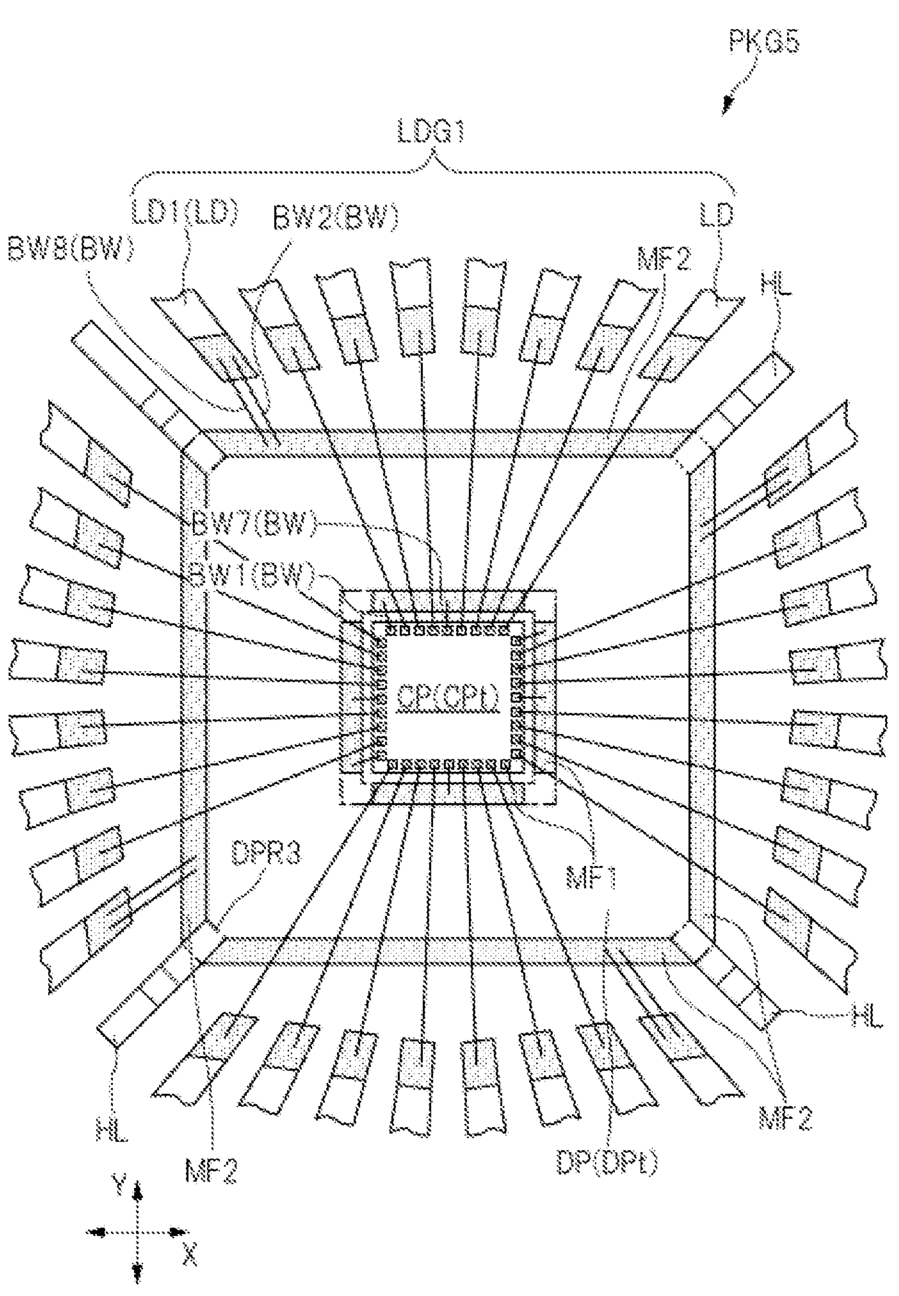
FIG. 12 is an enlarged plan view showing another modified example with respect to FIG. 5.
Figure 13:
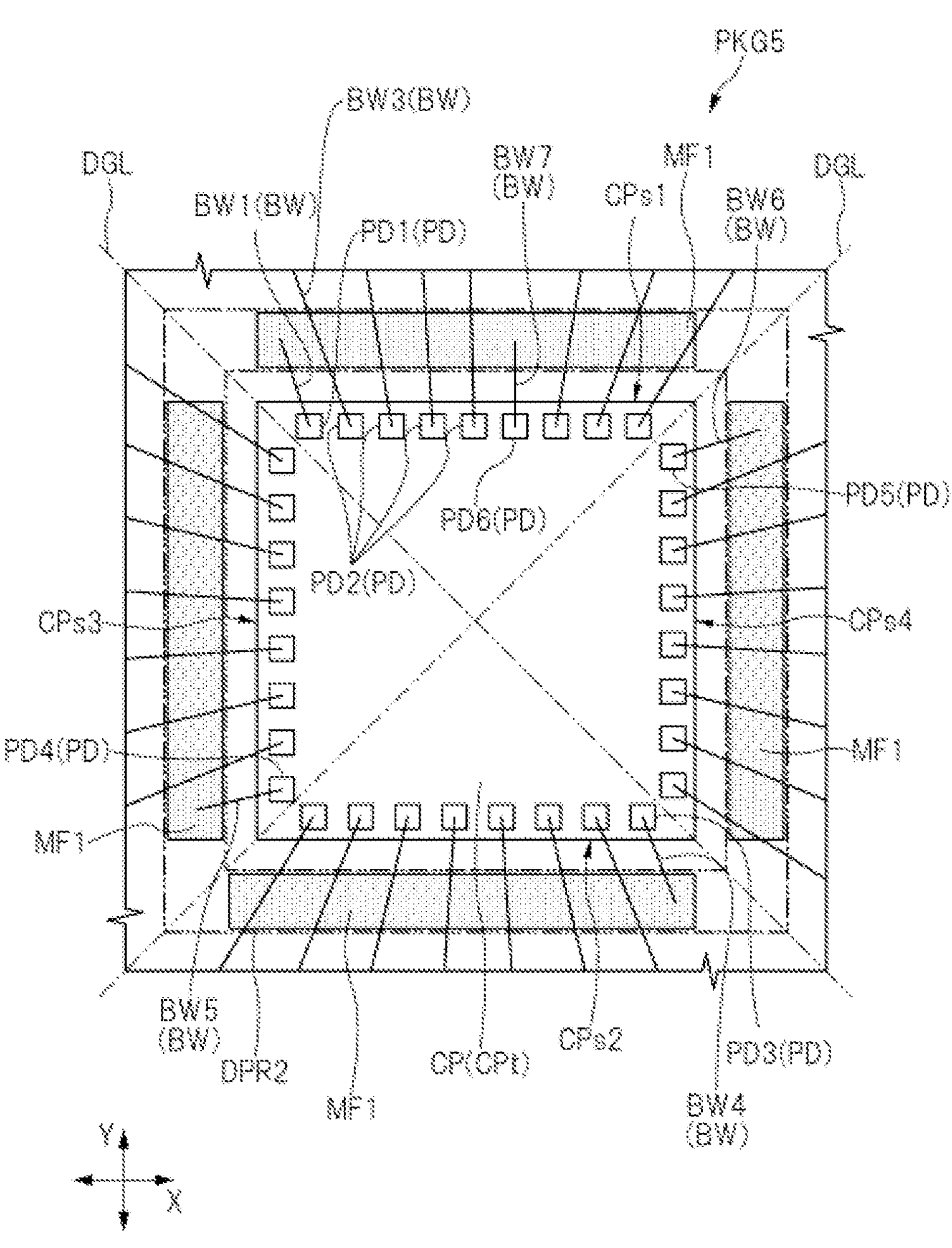
FIG. 13 is an enlarged plan view of the die pad shown in FIG. 12 at around the semiconductor chip.
Figure 14:
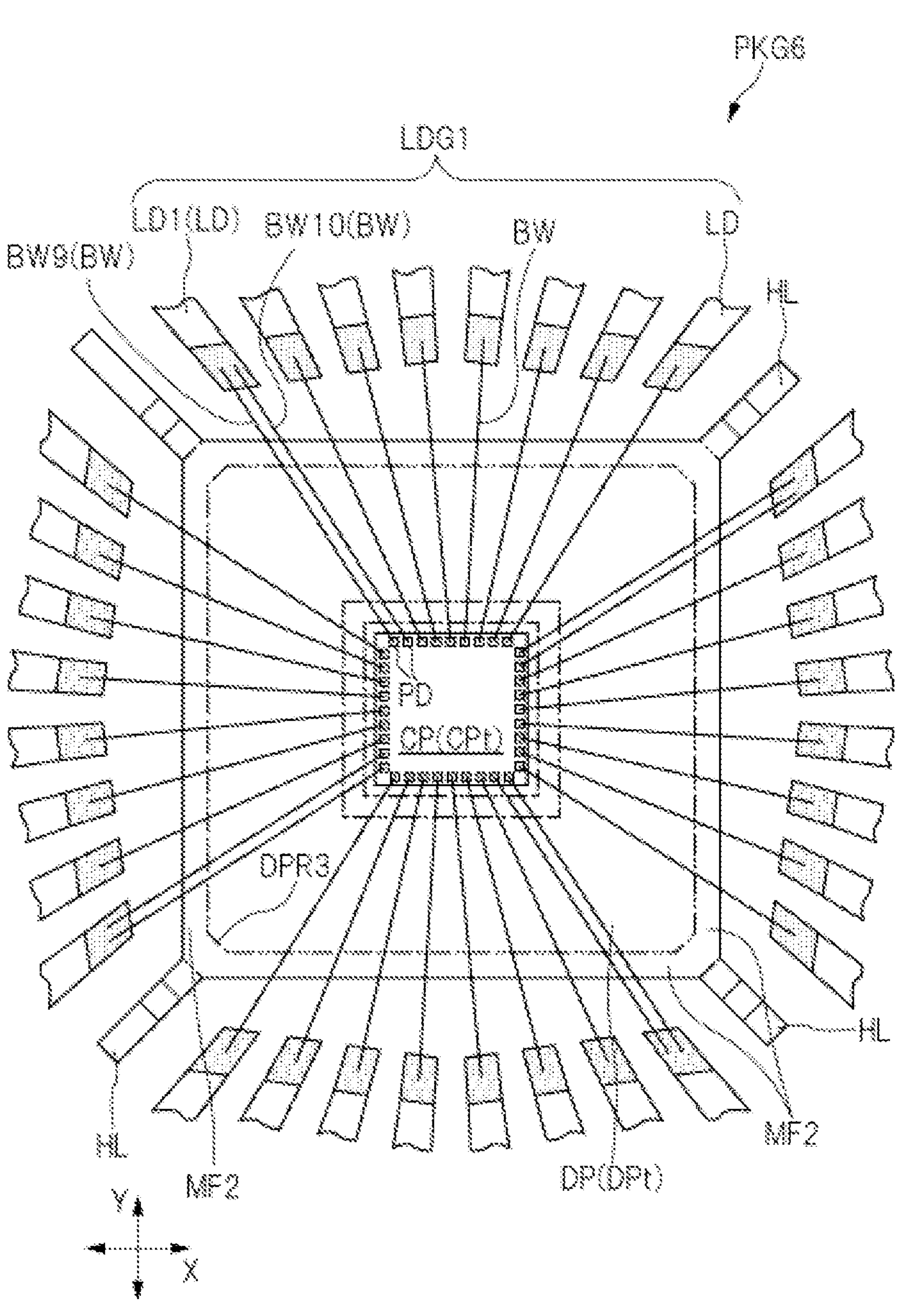
FIG. 14 is an enlarged plan view showing a studied example with respect to FIG. 12.

Next, a modified example in which two or more wires are bonded to one lead will be described. FIG. 12 is an enlarged plan view showing another modified example with respect to FIG. 5. FIG. 13 is an enlarged plan view of the die pad shown in FIG. 12 at around the semiconductor chip. FIG. 14 is an enlarged plan view showing a studied example with respect to FIG. 12.

A semiconductor device PKG5 shown in FIG. 12 is different from the semiconductor device PKG2 shown in FIG. 5 in that two or more wires are connected to one lead. The two or more wire LD1 connected to the lead BW include a wire BW2 and a wire BW8 bonded to each of the lead MF2 and the metal film. That is, in the semiconductor device PKG5 shown in FIG. 12, two or more wire BW2 are connected to one lead.

Each of the wire BW2 and the wire BW8 is a wire BW for connecting the lead LD1 and the metal film MF2, and has the same function. Therefore, the above expression can be paraphrased as follows. In other words, As described above, the wire BW has the largest impedance in the current path from the lead LD to the electrode pad PD of the semiconductor chip CP. According to the present modified example, when two or more wire BW are connected to a metal film MF2 provided at an outer edge of a die pad DP and a single lead LD1, a semiconductor device PKG6 shown in FIG. 14 has a higher degree of freedom in arrangement of the electrode pad PD.

In the semiconductor device PKG6 shown in FIG. 14, a wire BW9 and a wire BW10 are connected to the lead LD1 of the plurality of leads LD. Each of the wire BW9 and the wire BW10 is connected to the electrode pad PD. The electrode pad PD to which the wire BW9 is connected and the electrode pad PD to which the wire BW10 is connected are arranged adjacent to each other in the X-direction. This is to prevent the wire BW9 and the wire BW10 from contacting other wire BW. In this way, in the semiconductor device PKG6, the layout of the electrode pad PD is limited in order to prevent a short circuit caused by the contact of the wire BW.

On the other hand, in the semiconductor device PKG5 shown in FIGS. 12 and 13, each of the wire BW2 and the wire BW8 connected to the lead LD1 is connected to the metal film MF2. Since the metal film MF2 is electrically connected to the metal film MF1 via the die pad DP, the layouts of the wire BW1 and the wire BW7 shown in FIGS. 12 and 13 can be connected at any position. Hereinafter, an embodiment that can be realized by the highly flexible arrangement of the plurality of electrode pads PD included in the semiconductor device PKG5 illustrated in FIGS. 12 and 13 will be described.

For example, in the embodiment illustrated in FIG. 13, a plurality of electrode pads PD2 are arranged between an electrode pad PD1 to which a wire BW1 is bonded and an electrode pad PD6 to which a wire BW7 is bonded. Each of the plurality of electrode pads PD2 is not electrically connected to the die pad DP. In other words, each of the plurality of electrode pads PD2 is electrically isolated from the die pad DP.

Further, for example, as shown in FIG. 12, the plurality of read LD includes a read group LDG1 arranged along the first direction. The read LD1 is included in the read group LDG1 and is disposed at an end portion of the array of the read group LDG1 in the X-direction. As shown in FIG. 13, the electrode pads PD1 and the electrode pads PD2 are arranged adjacent to each other in the X-direction.

Further, for example, as shown in FIG. 12, the plurality of read LD includes a read group LDG1 arranged along the X-direction. The read LD1 is included in the read group LDG1 and is disposed at an end portion of the array of the read group LDG1 in the X-direction. As shown in FIG. 13, in the X-direction, either one of the plurality of electrode pads PD is disposed on both sides of the electrode pad PD6.

Further, as described above, in the present embodiment, since the metal film MF1 is provided along each of the four sides of the semiconductor chip CP, any electrode pad PD among the plurality of electrode pads PD can be connected to the die pad DP. For example, in the embodiment shown in FIG. 13, the plurality of wires BW includes a wire BW1, a wire BW4, a wire BW5, a wire BW6, and a wire BW7 bonded to a metal film MF1. The wire BW1 extends across the side CPs1 in a plan view. The wire BW4 is bonded to each of the electrode pad PD3 and the metal film MF1 of the plurality of electrode pads PD, and extends across the side CPs2. The wire BW5 is bonded to each of the electrode pad PD4 and the metal film MF1 of the plurality of electrode pads PD, and extends across the side CPs3. The wire BW6 is bonded to each of the electrode pad PD5 and the metal film MF1 of the plurality of electrode pads PD, and extends across the side CPs4. The wire BW7 is bonded to each of the electrode pad PD6 and the metal film MF1 of the plurality of electrode pads PD, and extends across the side CPs1.

In the present modified example, the lead LD1 is included in a reference potential supply path for supplying a reference potential to the semiconductor chip CP. The reference potential is a fixed potential having a value different from the power supply potential, and may be, for example, a ground potential (0 volts). The reference potential supply path serves as a power supply source for driving the circuitry of the semiconductor chip CP, and may be used in various applications. For example, a reference potential supply path may be used as a return path of a signal transmission path. In this way, the reference potential is used for various applications in addition to power supply. As described above, the current path passing through the die pad DP is particularly suitable for use as a reference potential supplying path because the layout-freedom of the electrode pad PD is high.

The semiconductor device PKG5 shown in FIGS. 12 and 13 are the same as the semiconductor device PKG2 shown in FIGS. 5 and 9 except for the above-mentioned differences. Therefore, duplicate explanation of the semiconductor device PKG5 will be omitted.

While the embodiments and the exemplary modified example have been described above with reference to the drawings, various modified example can be applied to the above-described techniques in addition to modified example described above. For example, in the above-described embodiments and modified example, the electrode pads PD are arranged in one row along each side of the semiconductor chip, but there are cases where the electrode pads are arranged in a plurality of rows along each side or a part of the side of the semiconductor chip.

In addition, in FIGS. 6 and 7, the wire bonding in which the end portion which is relatively close to the semiconductor chip CP is the first bond and the end portion which is far from the semiconductor chip CP is the second bond has been described. Although not shown, wire bonding may be applied in which an end portion closer to the semiconductor chip CP is a second bond and an end portion farther from the semiconductor chip CP is a first bond.

Furthermore, some or all of the configurations of the above-described embodiments and modified example can be combined with other modified example and applied.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:

a die pad having a first surface including a first region, a second region surrounding the first region in plan view, and a third region surrounding the second region in plan view;

a semiconductor chip having a second surface facing the first surface of the die pad, a third surface opposite the second surface, and a plurality of electrodes arranged on the third surface, the semiconductor chip being mounted on the die pad at the first region;

a plurality of leads arranged around the die pad in plan view;

a plurality of wires electrically connected the plurality of electrodes with the plurality of leads, respectively;

a first metal film provided in the second region of the die pad;

a second metal film provided in the third region of the die pad, the second metal film being electrically connected with the first metal film through the die pad; and a sealing body sealing the semiconductor chip, the plurality of wires and the first surface of the die pad, wherein, in plan view, the semiconductor chip, the first metal film and the second metal film are spaced apart from one another, and wherein the plurality of wires includes:

a first wire bonded to each of a first electrode of the plurality of electrodes and the first metal film; and a second wire bonded to each of a first lead of the plurality of leads and the second metal film.

2. The semiconductor device according to claim 1, wherein, in plan view, the semiconductor chip has four sides, wherein the plurality of electrodes is arranged along each of the four sides, and wherein the first metal film is provided along each of the four sides.

3. The semiconductor device according to claim 1, further comprising:

a third metal film provided in the second region of the die pad;

a fourth metal film provided in the second region of the die pad; and a fifth metal film provided in the second region of the die pad;

wherein, in plan view, the semiconductor chip is comprised of a quadrangle shape, and wherein, in plan view, the first metal film, the third metal film, the fourth metal film and the fifth metal film are spaced apart from one another at a position overlapping at least any one extended line of two diagonal lines of the quadrangle shape.

4. The semiconductor device according to claim 3, wherein, in plan view, the semiconductor chip has four sides, and wherein the first wire is extended in a direction perpendicular to one of the four sides.

5. The semiconductor device according to claim 1, wherein the second metal film is provided along an outer edge of the die pad.

6. The semiconductor device according to claim 5, wherein a plurality of suspension leads is connected to the die pad, wherein the second metal film has a plurality of portions, and wherein, in plan view, the plurality of portions is spaced apart from one another at a position overlapping at least any one extended line of the plurality of suspension leads.

7. The semiconductor device according to claim 1, wherein a total length of the first wire is less than a total length of the second wire.

8. The semiconductor device according to claim 1, wherein, in plan view, a distance between the first metal film and the second metal film is larger than a distance between the first metal film and the semiconductor chip.

9. The semiconductor device according to claim 1, wherein the plurality of wires includes a third wire bonded to each of a second electrode of the plurality of electrodes and a second lead of the plurality of leads, wherein the second electrode is electrically connected with the second lead without through the die pad, and wherein each of a total length of the first wire and a total length of the second wire is less than half of a total length of the third wire.

10. The semiconductor device according to claim 1, wherein the die pad has a fourth surface opposite the first surface, and wherein the fourth surface is sealed with the sealing body.

11. The semiconductor device according to claim 1, wherein, in plan view, an area of the first surface of the die pad is equal to or greater than 8 times of an area of the third surface of the semiconductor chip.

12. The semiconductor device according to claim 1, wherein the first lead is used as a path for supplying a power supply potential or a reference potential to the semiconductor chip.

13. The semiconductor device according to claim 1, wherein the plurality of wires includes a third wire bonded to each of a second electrode of the plurality of electrodes and a second lead of the plurality of leads, wherein the second electrode is electrically connected with the second lead without through the die pad, wherein the first wire has a first ball portion bonded to the first electrode, wherein the second wire has a second ball portion bonded to the second metal film, and wherein the third wire has a third ball portion bonded to the second electrode.

14. The semiconductor device according to claim 1, wherein two or more wires of the plurality of wires are bonded to the first lead, and wherein the two or more wires includes:

the second wire; and a fourth wire bonded to each of the first lead and the second metal film.

15. The semiconductor device according to claim 14, wherein the plurality of wires includes a third wire bonded to each of a second electrode of the plurality of electrodes and a second lead of the plurality of leads, wherein the second electrode is electrically connected with the second lead without through the die pad, wherein the plurality of leads includes a first lead group arranged in a first direction, wherein the first lead is included in the first lead group, wherein, in the first direction, the first lead is disposed at an end portion of an arrangement of the first lead group, and wherein, in the first direction, the first electrode and the second electrode are adjacent to each other.

16. The semiconductor device according to claim 14, wherein the plurality of leads includes a first lead group arranged in a first direction, wherein the first lead is included in the first lead group, wherein, in the first direction, the first lead is disposed at an end portion of an arrangement of the first lead group, and wherein, in the first direction, another electrode of the plurality of electrodes is disposed at both sides of the first electrode.

17. The semiconductor device according to claim 14, wherein the first lead is used as a path for supplying a power supply potential or a reference potential to the semiconductor chip, wherein, in plan view, the semiconductor chip has:

a first side;

a second side opposite the first side;

a third side crossing each of the first side and the second side; and a fourth side opposite the third side, and wherein the plurality of wires includes:

the first wire extended so as to straddle the first side;

a third wire bonded to each of a second electrode of the plurality of electrodes and a second lead of the plurality of leads, the second electrode being electrically connected with the second lead without through the die pad;

a fifth wire bonded to each of a third electrode of the plurality of electrodes and the first metal film, the fifth wire being extended so as to straddle the second side;

a sixth wire bonded to each of a fourth electrode of the plurality of electrodes and the first metal film, the sixth wire being extended so as to straddle the third side; and a seventh wire bonded to each of a fifth electrode of the plurality of electrodes and the first metal film, the seventh wire being extended so as to straddle the fourth side.

* * * * *